US012660471B2

(12) United States Patent
Jeon et al.

(10) Patent No.: US 12,660,471 B2
(45) Date of Patent: Jun. 16, 2026

(54) DISPLAY APPARATUS

(71) Applicant: SAMSUNG DISPLAY CO., LTD.,
Yongin-si (KR)

(72) Inventors: Yujin Jeon, Yongin-si (KR); Wonse Lee, Yongin-si (KR); Kicheol Kim, Yongin-si (KR); Choonghee Oh, Yongin-si (KR); Donghyeon Jang, Yongin-si (KR)

(73) Assignee: SAMSUNG DISPLAY CO., LTD.,
Gyeonggi-Do (KR)

( * ) Notice: Subject to any disclaimer, the term of this patent is extended or adjusted under 35 U.S.C. 154(b) by 992 days.

(21) Appl. No.: 17/826,572

(22) Filed: May 27, 2022

(65) Prior Publication Data

US 2023/0119532 A1     Apr. 20, 2023

(30) Foreign Application Priority Data

Oct. 20, 2021    (KR) ......................... 10-2021-0140482

(51) Int. Cl.
H10K 59/65         (2023.01)
G06F 3/044         (2006.01)
        (Continued)

(52) U.S. Cl.
CPC ........... H10K 59/65 (2023.02); G06F 3/0446 (2019.05); H10K 59/122 (2023.02);
        (Continued)

(58) Field of Classification Search
CPC ...... H10K 59/122; H10K 59/40; H10K 59/38; H10K 59/131; H10K 59/8792;
        (Continued)

(56) References Cited

U.S. PATENT DOCUMENTS 10,049,618 B2    8/2018   Jeong
10,761,386 B2    9/2020   Zhang et al.
        (Continued)

FOREIGN PATENT DOCUMENTS

CN          110658952 A      1/2020
KR     1020160119909 A      10/2016
        (Continued)

*Primary Examiner* — Jimmy H Nguyen

(74) *Attorney, Agent, or Firm* — CANTOR COLBURN LLP

(57)          ABSTRACT

A display apparatus includes: a substrate comprising a first area overlapping an optical device and a second area surrounding at least a portion of the first area; a first insulating layer arranged on the substrate; a first pixel electrode and a second pixel electrode arranged apart from each other and disposed on the first area of the first insulating layer; a third pixel electrode and a fourth pixel electrode arranged apart from each other and disposed on the second area of the first insulating layer; and a second insulating layer arranged on the first insulating layer and defining first to fourth openings exposing the first to fourth pixel electrodes, respectively, where the second insulating layer further defines an auxiliary opening exposing a portion of the first insulating layer in the first area, and the auxiliary opening is located between the first opening and the second opening.

16 Claims, 15 Drawing Sheets

(51) Int. Cl.

| | |
|---|---|
| *H10K 59/122* | (2023.01) |
| *H10K 59/131* | (2023.01) |
| *H10K 59/38* | (2023.01) |
| *H10K 59/40* | (2023.01) |
| *H10K 59/80* | (2023.01) |

(52) U.S. Cl.
CPC ........... *H10K 59/131* (2023.02); *H10K 59/38* (2023.02); *H10K 59/40* (2023.02); *H10K 59/8792* (2023.02)

(58) Field of Classification Search
CPC .... H10K 59/353; H10K 59/352; H10K 59/65; H10K 59/8791; H10K 59/30; H10K 30/87; H10K 50/85; G06F 3/0446
USPC ..................................................... 345/174, 76
See application file for complete search history.

(56) References Cited

U.S. PATENT DOCUMENTS

| | | | |
|---|---|---|---|
| 11,011,595 B2 | 5/2021 | Lee et al. | |
| 11,429,235 B2 | 8/2022 | Kim et al. | |
| 11,437,458 B2 | 9/2022 | Chung et al. | |
| 2019/0245017 A1* | 8/2019 | Jeon ...................... | H10K 59/40 |
| 2020/0312926 A1* | 10/2020 | Bae ...................... | H10K 59/126 |
| 2021/0265431 A1* | 8/2021 | Yun ...................... | H04N 23/57 |

FOREIGN PATENT DOCUMENTS

| | | |
|---|---|---|
| KR | 1020200015868 A | 2/2020 |
| KR | 1020200115888 A | 10/2020 |
| KR | 1020200135637 A | 12/2020 |
| KR | 1020210104399 A | 8/2021 |
| KR | 1020210113535 A | 9/2021 |

* cited by examiner

DISPLAY APPARATUS

This application claims priority to Korean Patent Application No. 10-2021-0140482, filed on Oct. 20, 2021, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

Usages of a display apparatus have been diversified. Also, as the display apparatus has become thinner and lighter, their range of use has expanded.

As an area occupied by a display area in the display apparatus has been increased, various functions applied or linked to the display apparatus have been added. As a method of increasing the area occupied by a display area while adding various functions, research has been conducted into display apparatuses having, within a display area, an area for adding various functions other than displaying images.

SUMMARY

One or more embodiments include a display apparatus wherein high light transmittance of a portion of a display area is secured.

Technical aspects to be achieved by the disclosure are not limited thereto. Other technical aspects that are not mentioned herein would be clearly understood by one of ordinary skill in the art based on the description of the disclosure.

Additional aspects will be set forth in part in the description which follows and, in part, will be apparent from the description, or may be learned by practice of the presented embodiments of the disclosure.

According to one or more embodiments, provided is a display apparatus including an optical device, and defining a first area overlapping the optical device and a second area surrounding at least a portion of the first area are therein. The display apparatus includes: a first insulating layer arranged on a substrate, a first pixel electrode and a second pixel electrode arranged apart from each other and disposed on the first area of the first insulating layer; a third pixel electrode and a fourth pixel electrode arranged apart from each other and disposed on the second area of the first insulating layer; and a second insulating layer arranged on the first insulating layer and defining first to fourth openings exposing the first to fourth pixel electrodes, respectively, where the second insulating layer further defines an auxiliary opening exposing a portion of the first insulating layer in the first area, and the auxiliary opening is located between the first opening and the second opening.

The display apparatus may further include an opposite electrode arranged on the second insulating layer, where a portion of the opposite electrode may be in contact with the exposed portion of the first insulating layer in the auxiliary opening.

The display apparatus may further include first to fourth emission layers arranged in the first to fourth openings, respectively, where the first and third emission layers may emit light of a first color, and the second and fourth emission layers may emit light of a second color.

A first distance between the first pixel electrode and the second pixel electrode may be the same as a second distance between the third pixel electrode and the fourth pixel electrode in a first direction.

The first pixel electrode and the third pixel electrode may be provided in plurality, and the number of first pixel electrodes per unit area may be the same as the number of third pixel electrodes per unit area.

A sum of a first width of a first portion of the second insulating layer and a second width of a second portion of the second insulating layer may be less than a third width of a third portion of the second insulating layer in a first direction, the first portion may be located between the first opening and the auxiliary opening, the second portion may be located between the second opening and the auxiliary opening, and the third portion may be located between the third opening and the fourth opening.

Light transmittance of the first area may be greater than light transmittance of the second area.

The display apparatus may further include: a third insulating layer arranged on the second insulating layer; and a conductive pattern arranged on the third insulating layer and defining a fifth opening exposing a portion of the third insulating layer, where the fifth opening may overlap the first opening and the auxiliary opening in a plan view.

The display apparatus may further include a light blocking layer arranged on the conductive pattern and defining a sixth opening overlapping the first opening and the auxiliary opening in the plan view.

The fifth opening may have a closed loop shape surrounding the sixth opening in the plan view, and the sixth opening may have a closed loop shape surrounding the first opening and the auxiliary opening in the plan view.

The display apparatus may further include a color filter layer arranged in the sixth opening of the light blocking layer and overlapping the first opening of the second insulating layer in the plan view.

The color filter layer may not overlap the auxiliary opening of the second insulating layer in the plan view.

The display apparatus may further include a conductive line arranged between the substrate and the first insulating layer and having a first portion and a second portion that are apart from each other with the auxiliary opening therebetween in a plan view.

The first pixel electrode and the second pixel electrode may be apart from each other in a first direction, and the conductive line may extend in the first direction.

The first pixel electrode and the second pixel electrode may be apart from each other in a first direction, and the conductive line may extend in a second direction crossing the first direction.

A first distance between the first opening and the auxiliary opening may be less than a second distance between the second opening and the auxiliary opening in a first direction.

A size of the first opening may be different from a size of the second opening in the plan view.

According to one or more embodiments, provided is a display apparatus including an optical device, and defining a first area overlapping the optical device and a second area surrounding at least a portion of the first area. The display apparatus includes: a pixel defining layer defining a first opening and an auxiliary opening arranged in the first area, and a second opening arranged in the second area; a first emission layer arranged in the first opening and which emits light of a first color; a second emission layer arranged in the second opening and which emits light of the first color; and a conductive layer including, in a plan view, a first mesh pattern defining a first hole overlapping the first opening and the auxiliary opening, and a second mesh pattern defining a second hole overlapping the second opening.

Each of the first hole and the second hole may have a polygonal shape in the plan view.

The number of sides of the first hole may be greater than the number of sides of the second hole.

The display apparatus may further include: an insulating layer arranged on the conductive layer; and a light blocking layer arranged on the insulating layer and defining a third opening exposing a first portion of the insulating layer and overlapping the first opening and the auxiliary opening, and a fourth opening exposing a second portion of the insulating layer and overlapping the second opening in the plan view, where a planar shape of the third opening may be different from a planar shape of the fourth opening in the plan view.

The display apparatus may further include: a first color filter layer arranged in the third opening of the light blocking layer and in contact with a part of the portion of the insulating layer, and a second color filter layer arranged in the fourth opening of the light blocking layer and in contact with an entirety of the second portion of the insulating layer.

The display apparatus may further include: a third emission layer arranged in the first area and which emits light of a second color; and a fourth emission layer arranged in the second area and which emits light of the second color, where the pixel defining layer may further define a third opening in which the third emission layer is arranged, and a fourth opening in which the fourth emission layer is arranged, the first mesh pattern of the conductive layer may further define a third hole overlapping the third opening in the plan view, and the second mesh pattern of the conductive layer may further define a fourth hole overlapping the fourth opening in the plan view.

The first hole may be larger than the second hole, and the third hole may be smaller than the fourth hole.

The display apparatus may further include a first conductive line extending in a first direction in the first area and having a first portion and a second portion that are apart from each other with the auxiliary opening therebetween in a plan view.

The display apparatus may further include a second conductive line extending in a second direction that crosses the first direction in the first area and having a first portion and a second portion that are apart from each other with the auxiliary opening therebetween in a plan view.

These and/or other aspects will become apparent and more readily appreciated from the following description of the embodiments, taken in conjunction with the accompanying drawings.

These general and specific embodiments may be implemented by using a system, a method, a computer program, or a combination of the system, the method, and the computer program.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
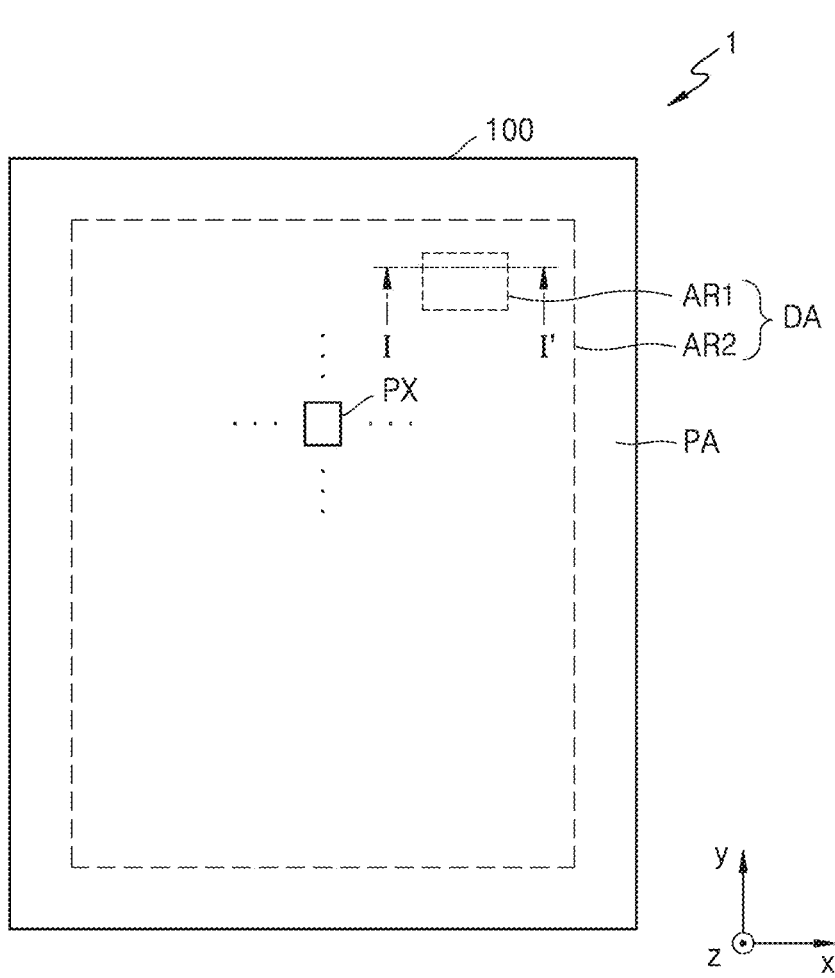
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or.". Throughout the disclosure, the expression "at least one of a, b or c" indicates only a, only b, only c, both a and b, both a and c, both b and c, all of a, b, and c, or variations thereof.

Since the disclosure may have diverse modified embodiments, certain embodiments are illustrated in the drawings and are described in the detailed description. Advantages and features of the disclosure, and implementation methods thereof will be clarified through following embodiments described with reference to the accompanying drawings. However, the disclosure is not limited to the embodiments disclosed hereinafter and may be realized in various forms.

Reference will now be made in detail to embodiments, examples of which are illustrated in the accompanying drawings, wherein like reference numerals refer to like elements throughout, and repeated description thereof will be omitted.

It will be understood that although the terms "first," "second," etc. may be used herein to describe various elements, these elements should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being disposed "on" another layer, area, or element, it can be directly or indirectly disposed on the other layer, region, or element. That is, for example, intervening layers, regions, or elements may be present.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

When a certain embodiment may be implemented differently, a specific process order may be performed differently from the described order. For example, two consecutively described processes may be performed substantially at the same time or performed in an order opposite to the described order.

In the specification, the term "A and/or B" refers to the case of A or B, or A and B. In the specification, the term "at least one of A and B" refers to the case of A or B, or A and B.

It will be understood that when a layer, region, or element is connected to another portion, the layer, region, or element may be directly connected to the portion, and/or an intervening layer, region, or element may exist, such that the layer, region, or element may be indirectly connected to the portion. For example, when a layer, region, or element is electrically connected to another portion, the layer, region, or element may be directly electrically connected to the portion and/or may be indirectly connected to the portion through another layer, region, or element.

An x-axis, a y-axis and a z-axis are not limited to three axes of the rectangular coordinate system and may be interpreted in a broader sense. For example, the x-axis, the y-axis, and the z-axis may be perpendicular to one another, or may represent different directions that are not perpendicular to one another.

FIG. 1 is a schematic plan view of a display apparatus according to an embodiment.

Referring to FIG. 1, a display apparatus 1 may include a display area DA that emits light and a peripheral area PA that does not emit light. The peripheral area PA may be a non-display area in which no pixels are arranged. The peripheral area PA may be arranged outside the display area DA. In other words, the peripheral area PA may surround at least a portion of the display area DA. Because the display apparatus 1 includes a substrate 100, it may be understood that the substrate 100 includes the display area DA and the peripheral area PA.

Pixels PX including various display elements such as organic light-emitting diodes ("OLED") may be arranged in the display area DA. The pixel PX may be provided in plurality, and the plurality of pixels PX may be arranged in various forms, such as a stripe arrangement, a pentile arrangement, and a mosaic arrangement, to implement an image.

The display area DA may include a first area AR1 and a second area AR2. The first area AR1 may be arranged adjacent to the second area AR2. For example, as illustrated in FIG. 1, the second area AR2 may be arranged outside the first area AR1. In other words, the second area AR2 may surround at least a portion of the first area AR1. The second area AR2 may be entirely or partially surrounded by the peripheral area PA.

Figure 9:
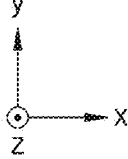
FIG. 9 is a schematic enlarged plan view of a portion of a first area of a display apparatus according to an embodiment.

In an embodiment, as illustrated in FIG. 9 to be described below, additional openings may be defined (or arranged) in the first area AR1, unlike in the second area AR2. Because the additional openings are defined (or arranged) only in the first area AR1 of the first area AR1 and the second area AR2, light transmittance of the first area AR1 may be greater than light transmittance of the second area AR2. The display apparatus 1 may include an optical device located in the first area AR1 having greater light transmittance than the second area AR2.

As described above, because the pixels PX are arranged in the display area DA, the first area AR1 may provide a first image by using light emitted from the pixels PX, and the second area AR2 may provide a second image by using the light emitted from the pixels PX. The first image and the second image may each correspond to a portion of one image, or may each be an independent image. A resolution of the first image provided by the first area AR1 may be substantially the same as a resolution of the second image provided by the second area AR2.

Although FIG. 1 illustrates that one first area AR1 is arranged inside the second area AR2, the present disclosure is not limited thereto. In another embodiment, the number of first areas AR1 may be two or more, and shapes and sizes of the two or more first areas AR1 may be different from each other.

Although FIG. 1 illustrates that the first area AR1 substantially has a rectangular shape, the present disclosure is not limited thereto. The shape of the first area AR1 in a plan view (or when viewed in a direction perpendicular to a surface of the substrate 100) may be variously changed to a circle, an oval, a polygon such as a rectangle, a star, a diamond, or the like.

Also, although FIG. 1 illustrates that the first area AR1 is arranged on one side (an upper right side) of the second area AR2 having a rectangular shape, the present disclosure is not limited thereto. In another embodiment, the first area AR1 may be arranged on one side (e.g., an upper left side or upper center) of the second area AR2 having a rectangular shape.

In addition, although FIG. 1 illustrates that the first area AR1 is entirely surrounded by the second area AR2, the present disclosure is not limited thereto. In another embodiment, the first area AR1 may be partially surrounded by the second area AR2, and a side surface of the first area AR1 that is not surrounded by the second area AR2 may be surrounded by the peripheral area PA.

In the present specification, the display apparatus 1 including an organic light-emitting display panel will be described as the display apparatus 1 according to an embodiment, but the display apparatus 1 of the present disclosure is not limited thereto. In another embodiment, the display apparatus 1 of the present disclosure may include a display panel such as an inorganic light-emitting display panel or a quantum dot light-emitting display panel. For example, an emission layer of a display element included in a display panel may include an organic material, an inorganic material, quantum dots, an organic material and quantum dots, or an inorganic material and quantum dots.

Figure 2:
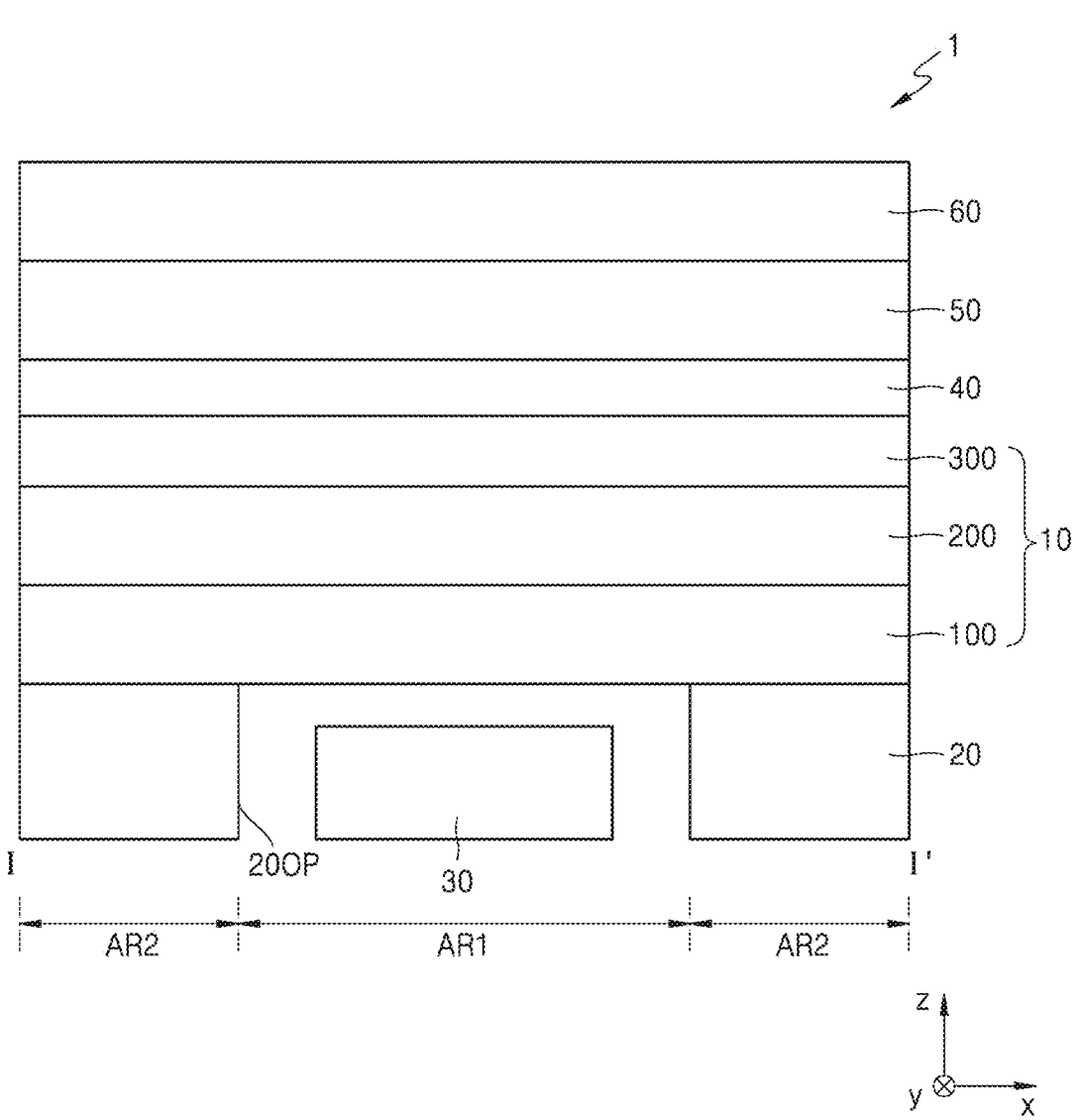
FIG. 2 is an example cross-sectional view of the display area of FIG. 1, taken along line I-I'.

FIG. 2 is an example cross-sectional view of the display area of FIG. 1, taken along line I-I'.

Referring to FIG. 2, the display apparatus 1 may include a display panel 10, a lower protective film 20, an optical device 30, a touch sensing layer 40, an optical functional layer 50, and a cover window 60.

The display panel 10 may include the substrate 100, a display layer 200 arranged on the substrate 100, and an encapsulation layer 300 arranged on the display layer 200.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multilayered structure including a layer including the above-described polymer resin and an inorganic layer.

The display layer 200 may include a circuit layer including a thin-film transistor, a display element layer including an OLED as a display element, and an insulating layer. The thin-film transistor and the display element may constitute a pixel, and may be electrically connected to each other.

The encapsulation layer 300 may cover the display layer 200. In some embodiments, the encapsulation layer 300 may include at least one inorganic encapsulation layer and/or at least one organic encapsulation layer. The at least one inorganic encapsulation layer may include at least one inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$), and may be formed by chemical vapor deposition (CVD) or the like. Zinc oxide ($ZnO_x$) may be zinc oxide (ZnO) and/or zinc peroxide ($ZnO_2$). The at least one organic encapsulation layer may include a polymer-based material. The polymer-based material may include a silicon-based resin, an acrylic resin, an epoxy-based resin, polyimide, and polyethylene.

FIG. 2 illustrates that the display layer 200 is covered by the encapsulation layer 300. However, in another embodiment, the display layer 200 may be sealed by an encapsulation substrate.

The lower protective film 20 may be arranged under the display panel 10 (e.g., in a −z direction: thickness direction). The lower protective film 20 may be attached to a lower surface of the substrate 100. An adhesive layer may be arranged between the lower protective film 20 and the substrate 100. Alternatively, the lower protective film 20 may be directly disposed on the lower surface of the substrate 100, and in this case, the adhesive layer may not be arranged between the lower protective film 20 and the substrate 100.

The lower protective film 20 may support and protect the substrate 100. The lower protective film 20 may define an opening 200P corresponding to the first area AR1. By forming the opening 200P in the lower protective film 20, the light transmittance of the first area AR1 may be improved. The lower protective film 20 may include polyethylene terephthalate ("PET") or polyimide ("PI").

FIG. 2 illustrates that the lower protective film 20 defines the opening 200P corresponding to the first area AR1. However, in another embodiment, the opening 200P of the lower protective film 20 may be omitted.

The optical device 30 may be located in the first area AR1. As described above with reference to FIG. 1, by forming (or arranging) additional openings (e.g., AOP in FIG. 4) in the first area AR1, the light transmittance of the first area AR1 may be improved. The optical device 30 may emit light through the first area AR1 having improved light transmittance, or may receive light through the first area AR1.

The optical device 30 may be an electronic element using light or sound. For example, the electronic element may be a sensor that measures a distance (e.g., a proximity sensor), a sensor that recognizes a body part of a user (e.g., a fingerprint, an iris, a face, etc.), a small lamp that outputs light, an image sensor that captures an image (e.g., a camera), or the like. The electronic element using light may use light of various wavelength bands, such as visible light, infrared light, and ultraviolet light. The electronic element using sound may use ultrasonic waves or sound of other frequency bands.

One optical device 30 or a plurality of optical devices 30 may be arranged in the first area AR1. In some embodiments, the optical device 30 may include a light emitter and a light receiver. The light emitter and the light receiver may be integrated with each other, or may be physically separated from each other such that a pair of a light emitter and a light receiver may constitute one optical device 30.

The touch sensing layer 40 may be formed on the encapsulation layer 300. Alternatively, the touch sensing layer 40 may be separately formed and then coupled to the encapsulation layer 300 through an adhesive layer such as an optically clear adhesive ("OCA"). In an embodiment, as illustrated in FIG. 2, the touch sensing layer 40 may be formed directly on the encapsulation layer 300, and in this case, the adhesive layer may not be arranged between the touch sensing layer 40 and the encapsulation layer 300.

The touch sensing layer 40 may obtain coordinate information according to an external input, for example, a touch event. The touch sensing layer 40 may include a sensing electrode and signal lines connected to the sensing electrode. The touch sensing layer 40 may sense an external input by using a mutual-cap method or a self-cap method.

The optical functional layer 50 may be disposed on the touch sensing layer 40. The optical functional layer 50 may include an anti-reflection layer. The anti-reflection layer may reduce reflectivity of light (external light) that is incident from an external source toward the display panel 10.

In some embodiments, the optical functional layer 50 may be a polarization film.

In some embodiments, the optical functional layer 50 may be implemented using a filter plate including a black matrix and color filters.

The cover window 60 may be arranged on the optical functional layer 50. The cover window 60 may protect the display panel 10.

The cover window 60 may be a flexible window. The cover window 60 may protect the display panel 10 while being easily bent according to an external force without cracking and the like. The cover window 60 may include glass, sapphire, or plastic. For example, the cover window 60 may include ultra-thin glass (UTG®) or colorless polyimide ("CPI"). In an embodiment, the cover window 60 may have a structure in which a flexible polymer layer is arranged on one surface of a glass substrate, or may include only a polymer layer.

Figure 3:
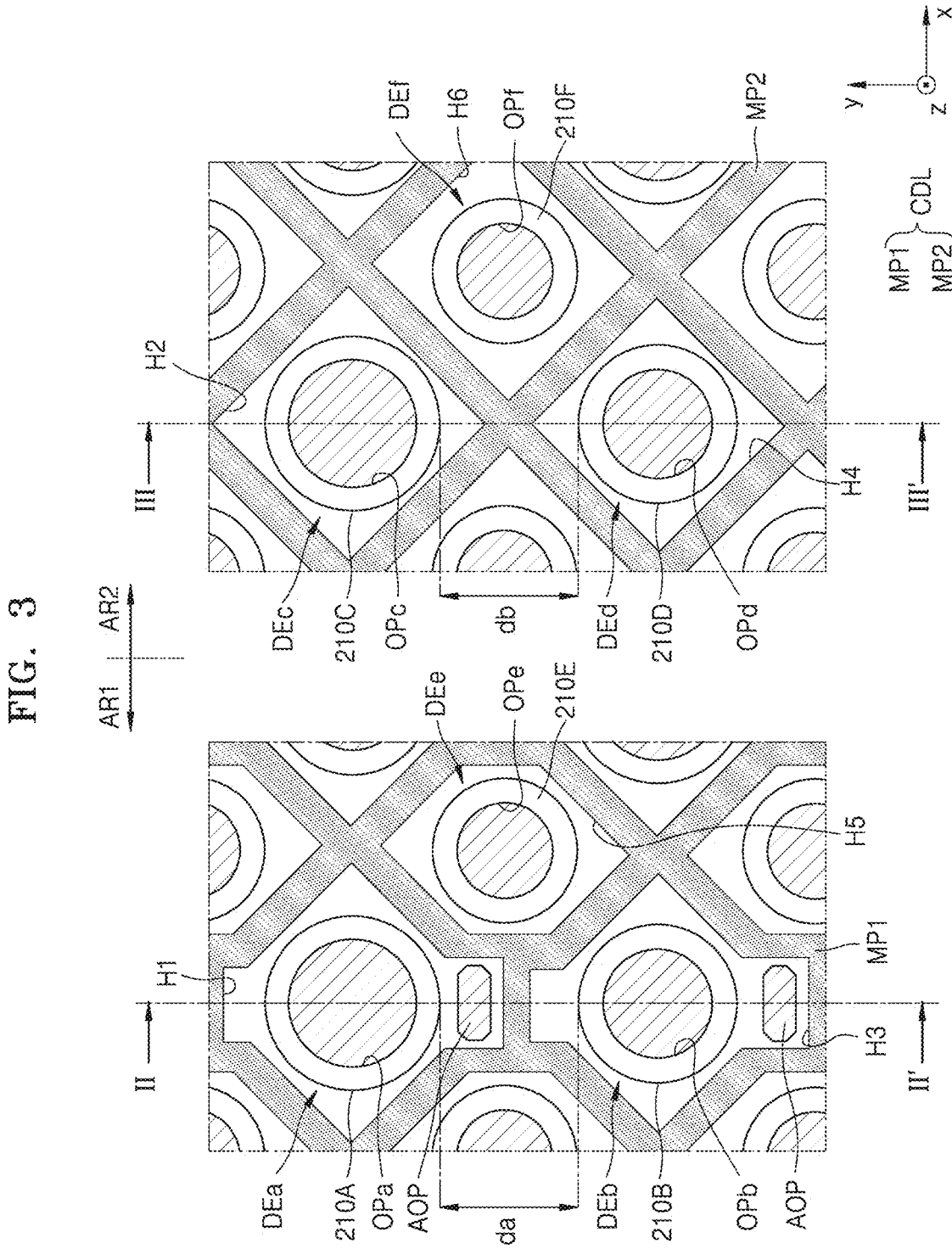
FIG. 3 is a schematic enlarged plan view of a portion of a display apparatus according to an embodiment.

FIG. 3 is a schematic enlarged plan view of a portion of a display apparatus according to an embodiment. In detail, FIG. 3 illustrates display elements and a conductive layer arranged in each of a first area and a second area, and some members may be omitted.

Referring to FIG. 3, a first display element DEa, a second display element DEb, and a fifth display element DEe may be arranged in the first area AR1 of the display apparatus 1, and a third display element DEc, a fourth display element DEd, and a sixth display element DEf may be arranged in the second area AR2 of the display apparatus 1.

The first display element DEa, the second display element DEb, and the fifth display element DEe may implement different colors from each other. For example, the first display element DEa may implement a blue color, the second display element DEb may implement a red color, and the fifth display element DEe may implement a green color. The third display element DEc, the fourth display element DEd, and the sixth display element DEf may implement different colors from each other. For example, the third display element DEc may implement a blue color, the fourth display element DEd may implement a red color, and the sixth display element DEf may implement a green color.

The first display element DEa may include a first pixel electrode 210A. The second display element DEb may include a second pixel electrode 210B. The third display element DEc may include a third pixel electrode 210C. The fourth display element DEd may include a fourth pixel electrode 210D. The fifth display element DEe may include a fifth pixel electrode 210E. The sixth display element DEf may include a sixth pixel electrode 210F. A first distance da between the first pixel electrode 210A and the second pixel electrode 210B may be substantially the same as a second distance db between the third pixel electrode 210C and the fourth pixel electrode 210D.

Figure 4:
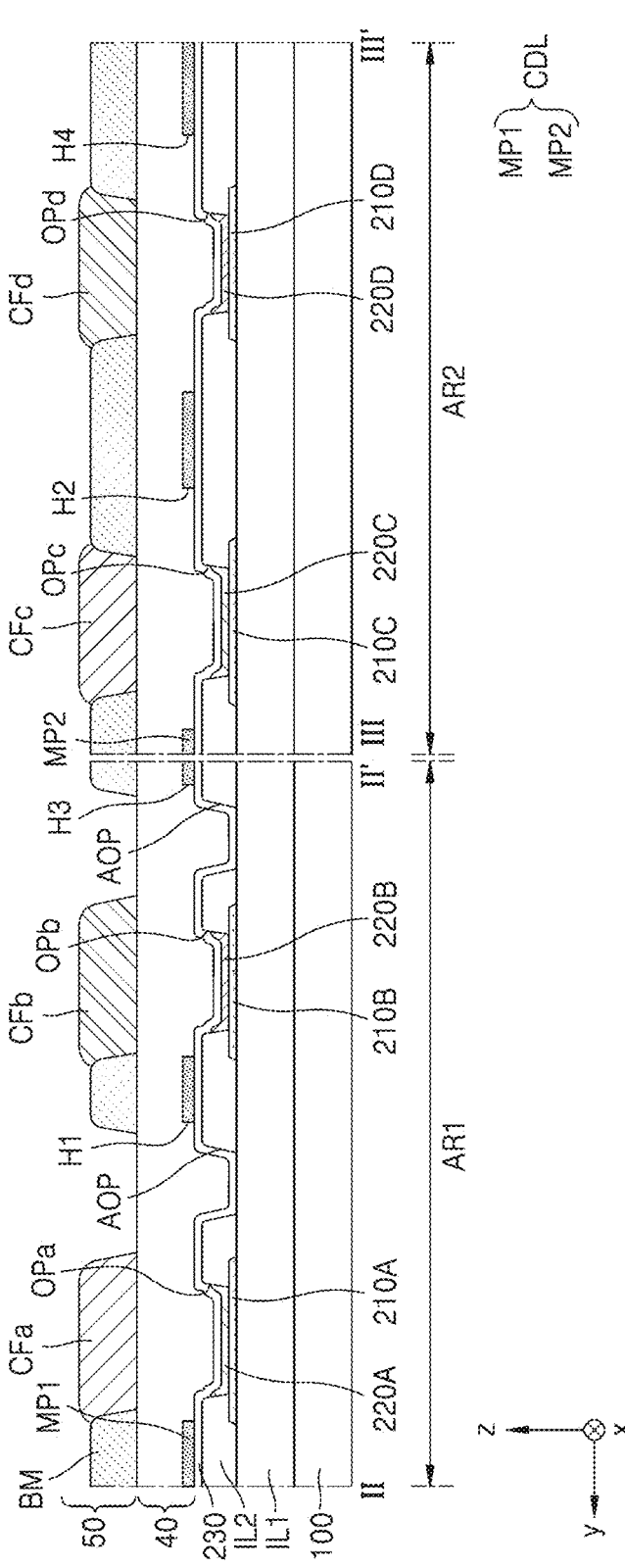
FIG. 4 is an example cross-sectional view of a region of FIG. 3, taken along lines II-II' and III-III'.

An emission area of the first display element DEa may be defined by a first opening OPa exposing the first pixel electrode 210A. An emission area of the second display element DEb may be defined by a second opening OPb exposing the second pixel electrode 210B. An emission area of the third display element DEc may be defined by a third opening OPc exposing the third pixel electrode 210C. An emission area of the fourth display element DEd may be defined by a fourth opening OPd exposing the fourth pixel electrode 210D. An emission area of the fifth display element DEe may be defined by a fifth opening OPe exposing the fifth pixel electrode 210E. An emission area of the sixth display element DEf may be defined by a sixth opening OPf exposing the sixth pixel electrode 210F. As illustrated in FIG. 4 to be described below, the first to sixth openings OPa, OPb, OPc, OPd, OPe, and OPf may be defined in a second insulating layer IL2.

In an embodiment, an auxiliary opening AOP may be arranged between the first opening OPa and the second opening OPb. As illustrated in FIG. 4 to be described below, the auxiliary opening AOP may expose a portion of a first insulating layer IL1 on which the first pixel electrode 210A and the second pixel electrode 210B are arranged. The auxiliary opening AOP may be defined in the second insulating layer IL2.

As such, unlike in the second area AR2, the auxiliary openings AOP may be located in the first area AR1. That is, the auxiliary openings AOP may not be located in the second area AR2. In addition to the openings that define the emission areas of the display elements, respectively, separate auxiliary openings AOP may be arranged (or defined) in the first area AR1. In this case, because light and/or sound may pass through the separate auxiliary openings AOP, the light transmittance of the first area AR1 may be improved. The light transmittance of the first area AR1 may be greater than the light transmittance of the second area AR2. Because the light transmittance of the first area AR1 is improved, as described above with reference to FIG. 2, functions of the optical device 30 overlapping the first area AR1 may not be limited. The optical device 30 may emit light through the first area AR1 having improved light transmittance, or may receive light through the first area AR1.

A conductive layer CDL may be arranged in the display apparatus 1. The conductive layer CDL may include a first mesh pattern MP1 arranged in the first area AR1 and a second mesh pattern MP2 arranged in the second area AR2. the touch sensing layer 40 described above with reference to FIG. 2 may include the first mesh pattern MP1 and the second mesh pattern MP2. For example, the first mesh pattern MP1 and the second mesh pattern MP2 may constitute a sensing electrode.

The first mesh pattern MP1 may define a first hole H1 overlapping the first opening OPa and the auxiliary opening AOP, a third hole H3 overlapping the second opening OPb and the auxiliary opening AOP, and a fifth hole H5 overlapping the fifth opening OPe in a plan view. The second mesh pattern MP2 may define a second hole H2 overlapping the third opening OPc, a fourth hole H4 overlapping the fourth opening OPd, and a sixth hole H6 overlapping the sixth opening OPf in a plan view. A planar shape of the first hole H1 may be different from a planar shape of the second hole H2, a planar shape of the third hole H3 may be different from a planar shape of the fourth hole H4, and a planar shape of the fifth hole H5 may be different from a planar shape of the sixth hole H6 in a plan view.

FIG. 4 is an example cross-sectional view of a region of FIG. 3, taken along lines II-II' and III-III'. In detail, FIG. 4 illustrates a structure in which a touch sensing layer and an optical functional layer are sequentially arranged over the display elements of FIG. 3, and some members may be omitted.

Referring to FIG. 4, the first insulating layer IL1 may be arranged on the substrate 100. The first pixel electrode 210A and the second pixel electrode 210B that are apart from each other may be arranged on the first area AR1 of the first insulating layer IL1, and the third pixel electrode 210C and the fourth pixel electrode 210D that are apart from each other may be arranged on the second area AR2 of the first insulating layer IL1.

The second insulating layer IL2 may be arranged on the first insulating layer IL1. The second insulating layer IL2 may define the first to fourth openings OPa, OPb, OPc, and OPd exposing the first to fourth pixel electrodes 210A, 210B, 210C, and 210D, respectively. The second insulating layer IL2 may further define the auxiliary opening AOP exposing a portion of the first insulating layer IL1 in the first area AR1. The auxiliary opening AOP may be located between the first opening OPa and the second opening OPb.

A first organic emission layer 220A may be arranged in the first opening OPa, and a second organic emission layer 220B may be arranged in the second opening OPb. A third organic emission layer 220C may be arranged in the third opening OPc, and a fourth organic emission layer 220D may be arranged in the fourth opening OPd. The first organic emission layer 220A and the third organic emission layer 220C may emit blue light, and the second organic emission layer 220B and the fourth organic emission layer 220D may emit red light.

An opposite electrode 230 may be arranged on the second insulating layer IL2. The opposite electrode 230 may be a transparent electrode or a reflective electrode. A portion of the opposite electrode 230 may be in contact with the portion of the first insulating layer IL1 in the auxiliary opening AOP.

The touch sensing layer 40 may be arranged on the opposite electrode 230. The touch sensing layer 40 may include the conductive layer CDL. The conductive layer CDL may include the first mesh pattern MP1 arranged in the first area AR1 and the second mesh pattern MP2 arranged in the second area AR2. The first mesh pattern MP1 may define the first hole H1 overlapping the first opening OPa and the auxiliary opening AOP, and the third hole H3 overlapping the second opening OPb and the auxiliary opening AOP (i.e., another auxiliary opening AOP) in a plan view. The second mesh pattern MP2 may define the second hole H2 overlapping the third opening OPc and the fourth hole H4 overlapping the fourth opening OPd in a plan view.

The optical functional layer 50 may be arranged on the touch sensing layer 40. The optical functional layer 50 may include a light blocking layer BM and color filter layers.

The light blocking layer BM define openings overlapping the first opening OPa and the auxiliary opening AOP, the second opening OPb and the auxiliary opening AOP, the third opening OPc, and the fourth opening OPd, respectively. In other words, the light blocking layer BM may define openings overlapping the first to fourth holes H1, H2, H3, and H4, respectively.

A first color filter layer CFa may be arranged in the opening of the light blocking layer BM that overlaps the first hole H1, and a second color filter layer CFb may be arranged in the opening of the light blocking layer BM that overlaps the second hole H2 in a plan view. A third color filter layer CFc may be arranged in the opening of the light blocking layer BM that overlaps the third hole H3, and a fourth color filter layer CFd may be arranged in the opening of the light blocking layer BM that overlaps the fourth hole H4. The first color filter layer CFa and the third color filter layer CFc may transmit only blue light, and the second color filter layer CFb and the fourth color filter layer CFd may transmit only red light.

The first color filter layer CFa may overlap the first opening OPa, and the second color filter layer CFb may overlap the second opening OPb. The first color filter layer CFa and the second color filter layer CFb may not overlap the auxiliary opening AOP in a plan view. Because the first color filter layer CFa and the second color filter layer CFb do not overlap the auxiliary opening AOP, the improvement in light transmittance of the first area AR1 due to the auxiliary opening AOP may increase.

Figure 5:
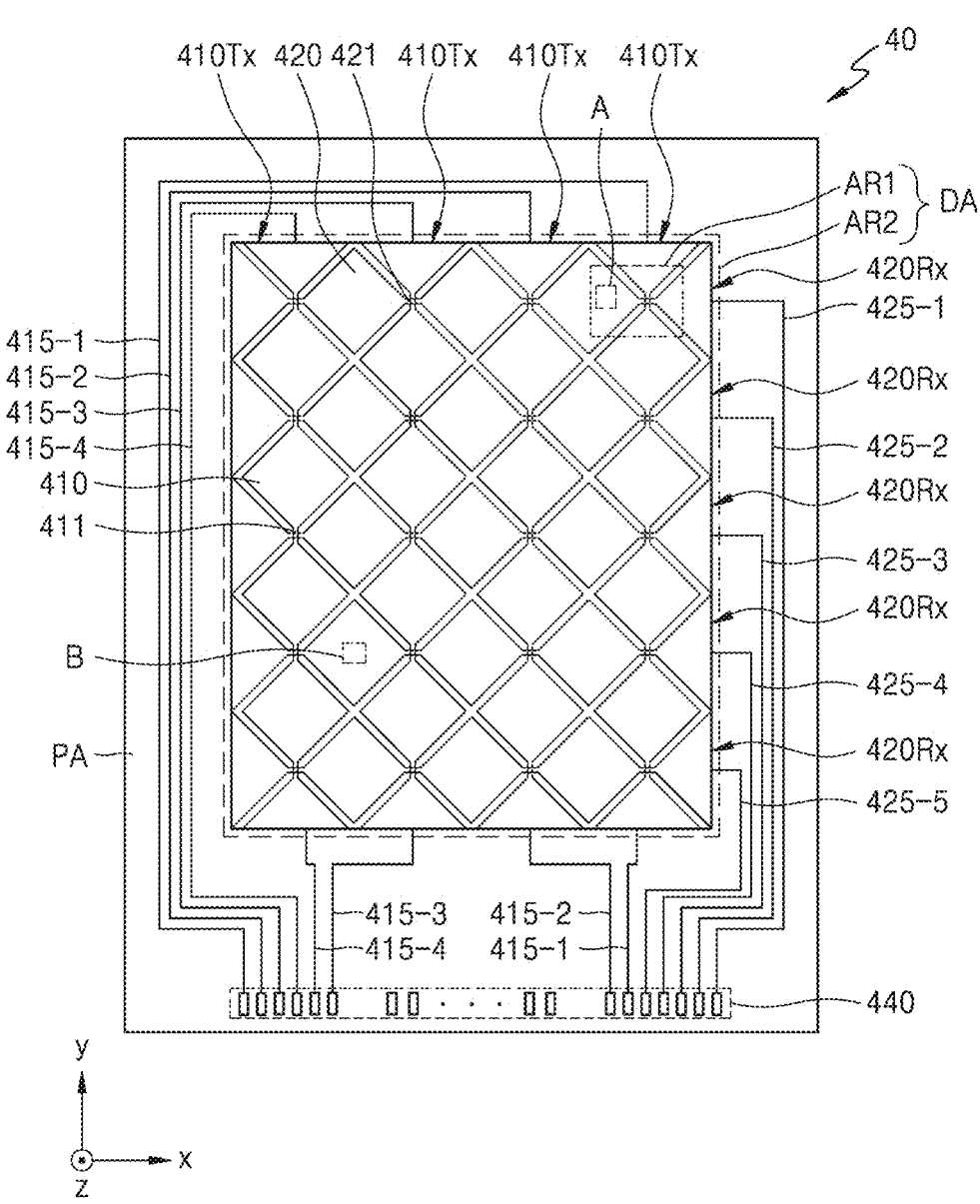
FIG. 5 is a schematic plan view of a touch sensing layer included in a display apparatus according to an embodiment.

FIG. 5 is a schematic plan view of a touch sensing layer included in a display apparatus according to an embodiment.

Referring to FIG. 5, the touch sensing layer 40 may include a plurality of first sensing electrode lines 410Tx, first trace lines 415-1 to 415-4 connected to the plurality of first sensing electrode lines 410Tx, a plurality of second sensing electrode lines 420Rx, and second trace lines 425-1 to 425-5 connected to the plurality of second sensing electrode lines 420Rx.

The plurality of first sensing electrode lines 410Tx and the plurality of second sensing electrode lines 420Rx may be arranged in the display area DA, and the first trace lines 415-1 to 415-4 and the second trace lines 425-1 to 425-5 may be arranged in the peripheral area PA.

The plurality of first sensing electrode lines 410Tx may include a plurality of first sensing electrodes 410 and a plurality of first connection electrodes 411. The plurality of first connection electrodes 411 may be located between the plurality of first sensing electrodes 410. The first sensing electrodes 410 adjacent to each other may be connected to each other through the first connection electrode 411 therebetween.

The plurality of first sensing electrode lines 410Tx may extend in a first direction (e.g., ±y direction). The plurality of first sensing electrodes 410 included in each of the plurality of first sensing electrode lines 410Tx may be arranged in the first direction (e.g., ±y direction).

The plurality of second sensing electrode lines 420Rx may include a plurality of second sensing electrodes 420 and a plurality of second connection electrodes 421. The plurality of second connection electrodes 421 may be located between the plurality of second sensing electrodes 420. The plurality of second sensing electrodes 420 adjacent to each other may be connected to each other through the plurality of second connection electrodes 421.

The plurality of second sensing electrode lines 420Rx may extend in a second direction (e.g., ±x direction) crossing the first direction (e.g., ±y direction). The plurality of second sensing electrodes 420 included in each of the plurality of second sensing electrode lines 420Rx may be arranged in the second direction (e.g., ±x direction).

The plurality of first sensing electrode lines 410Tx and the plurality of second sensing electrode lines 420Rx may cross each other. For example, the plurality of first sensing electrode lines 410Tx and the plurality of second sensing electrode lines 420Rx may vertically cross each other.

Touch sensors may be located in portions where the plurality of first sensing electrode lines 410Tx and the plurality of second sensing electrode lines 420Rx cross each other. The touch sensor may correspond to a portion where the first connection electrode 411 and the second connection electrode 421 cross each other. In other words, the touch sensor may correspond to a portion where the first connection electrode 411 and the second connection electrode 421 overlap each other.

The first sensing electrodes 410 may be located above and below the touch sensor (e.g., in the y direction), respectively, and the second sensing electrodes 420 may be located on left and right sides (e.g., in the x direction) of the touch sensor, respectively. The touch sensor may detect presence or absence of a touch through the first sensing electrodes 410 and the second sensing electrodes 420 located around the touch sensor.

The plurality of first sensing electrode lines 410Tx may be connected to pads of a sensing signal pad portion 440 through the first trace lines 415-1 to 415-4 disposed in the peripheral area PA. For example, the first trace lines 415-1 to 415-4 may have a double routing structure connected to upper and lower sides of the plurality of first sensing electrode lines 410Tx, respectively. The first trace lines 415-1 to 415-4 connected to the upper and lower sides of the plurality of first sensing electrode lines 410Tx, respectively, may be connected to the corresponding pads, respectively.

The plurality of second sensing electrode lines 420Rx may be connected to the pads of the sensing signal pad portion 440 through the second trace lines 425-1 to 425-5 disposed in the peripheral area PA. For example, the second trace lines 425-1 to 425-5 may be connected to the corresponding pads, respectively.

FIG. 5 illustrates a double routing structure in which the first trace lines 415-1 to 415-4 are connected to the upper and lower sides of the plurality of first sensing electrode lines 410Tx, respectively, and this structure may improve sensing sensitivity. In another embodiment, the first trace lines 415-1 to 415-4 may have a single structure connected to the upper or lower side of the plurality of first sensing electrode lines 410Tx.

Figure 6:
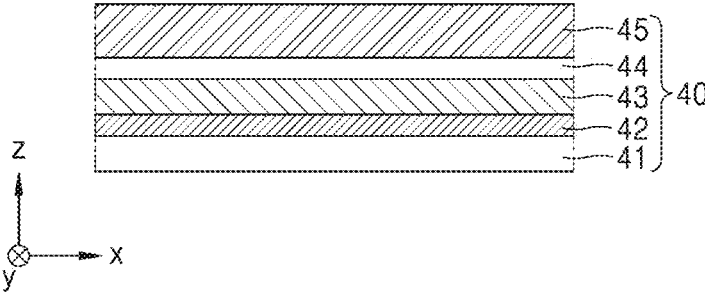
FIG. 6 is a schematic cross-sectional view of a stacked structure of a touch sensing layer included in a display apparatus according to an embodiment.

FIG. 6 is a schematic cross-sectional view of a stacked structure of a touch sensing layer included in a display apparatus according to an embodiment.

Referring to FIG. 6, the touch sensing layer 40 may include a first conductive layer 42 and a second conductive layer 44. A first sensing insulating layer 41 may be located under the first conductive layer 42. A second sensing insulating layer 43 may be arranged between the first conductive layer 42 and the second conductive layer 44. A third sensing insulating layer 45 may be located on the second conductive layer 44. Each of the first sensing electrodes 410, the first connection electrodes 411, the second sensing electrodes 420, and the second connection electrodes 421 illustrated in FIG. 5 may be included in one of the first conductive layer 42 and the second conductive layer 44.

The first conductive layer 42 and the second conductive layer 44 may include a metal layer or a transparent conductive layer. The metal layer may include molybdenum (Mo), mendelevium (Mb), silver (Ag), titanium (Ti), copper (Cu), aluminum (Al), or an alloy thereof. The transparent conductive layer may include a transparent conductive oxide such as indium tin oxide ("ITO"), indium zinc oxide ("IZO"), zinc oxide (ZnO), or indium tin zinc oxide ("ITZO"). In addition, the transparent conductive layer may include a conductive polymer such as PEDOT, metal nanowires, graphene, or the like.

The first conductive layer 42 and the second conductive layer 44 may have a single-layered or multi-layered structure. The first conductive layer 42 and the second conductive layer 44 having a single-layered structure may include a metal layer or a transparent conductive layer, and materials of the metal layer and the transparent conductive layer may be the same as described above. One of the first conductive layer 42 and the second conductive layer 44 may include a single metal layer. The single metal layer may include a Mo layer, or an alloy layer of MoMb. One of the first conductive layer 42 and the second conductive layer 44 may include a plurality of metal layers. The plurality of metal layers may include, for example, three layers of Ti layer/Al layer/Ti layer, or two layers of Mo layer/Mb layer. Alternatively, the plurality of metal layers may include a metal layer and a transparent conductive layer. The first conductive layer 42 and the second conductive layer 44 may have different stacked structures or may have the same stacked structure. For example, the first conductive layer 42 may include a metal layer, and the second conductive layer 44 may include a transparent conductive layer. Alternatively, the first conductive layer 42 and the second conductive layer 44 may include the same metal layer.

Materials of the first conductive layer 42 and the second conductive layer 44 and an arrangement of sensing electrodes (corresponding to 410 and 420 of FIG. 5) provided in the first conductive layer 42 and the second conductive layer 44 may be determined considering sensing sensitivity of the sensing electrodes. A resistor-capacitor ("RC") delay may affect the sensing sensitivity of the sensing electrodes, and because the sensing electrodes including a metal layer may have a low resistance compared to the sensing electrodes including a transparent conductive layer, an RC value may be reduced, and thus, a charge time of a capacitor defined between the sensing electrodes may be reduced. The sensing electrodes including the transparent conductive layer may not be visually recognized by the user compared to the sensing electrodes including the metal layer, and an input area may increase to increase capacitance.

The first sensing insulating layer 41, the second sensing insulating layer 43, and the third sensing insulating layer 45 may each include an inorganic insulating material and/or an organic insulating material. The inorganic insulating material may include silicon oxide, silicon nitride, or silicon oxynitride, and the organic insulating material may include a high-molecular weight organic material.

Some of the first and second sensing electrodes 410 and 420 and the first and second connection electrodes 411 and 421 described above with reference to FIG. 5 may be located in the first conductive layer 42, and the others may be located in the second conductive layer 44.

In an embodiment, the first conductive layer 42 may include the first connection electrodes 411, and the second conductive layer 44 may include the first and second sensing electrodes 410 and 420 and the second connection electrodes 421. In another embodiment, the first conductive layer 42 may include the first and second sensing electrodes 410 and 420 and the second connection electrodes 421, and the second conductive layer 44 may include the first connection electrodes 411. In another embodiment, the first conductive layer 42 may include the first sensing electrodes 410 and the first connection electrodes 411, and the second conductive layer 44 may include the second sensing electrodes 420 and the second connection electrodes 421. In this case, the first sensing electrodes 410 and the first connection electrodes 411 may be provided on the same layer to be integrally connected to each other. Because the second sensing electrodes 420 and the second connection electrodes 421 are also provided on the same layer, a contact hole may not be provided in an insulating layer between the first conductive layer 42 and the second conductive layer 44.

FIG. 6 illustrates that the touch sensing layer 40 includes the first sensing insulating layer 41, the first conductive layer 42, the second sensing insulating layer 43, the second conductive layer 44, and the third sensing insulating layer 45. However, in another embodiment, the first sensing insulating layer 41 arranged under the first conductive layer 42 may be omitted.

Figure 7:
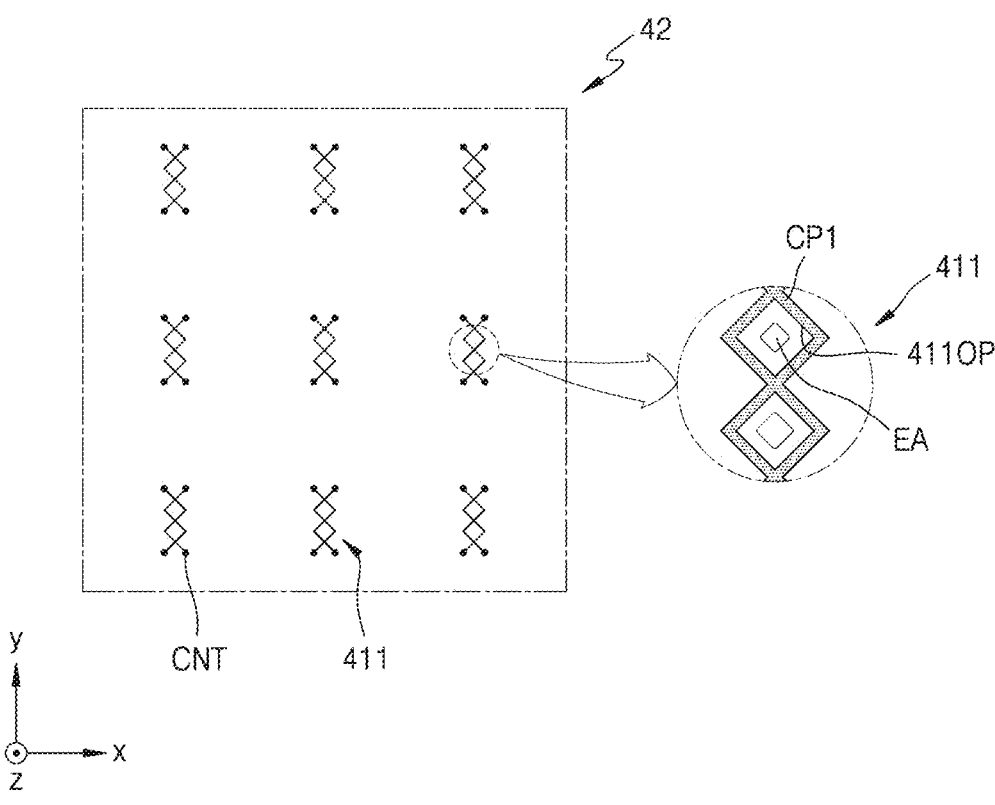
FIG. 7 is a schematic plan view of a first conductive layer in a touch sensing layer included in a display apparatus according to an embodiment.
Figure 8:
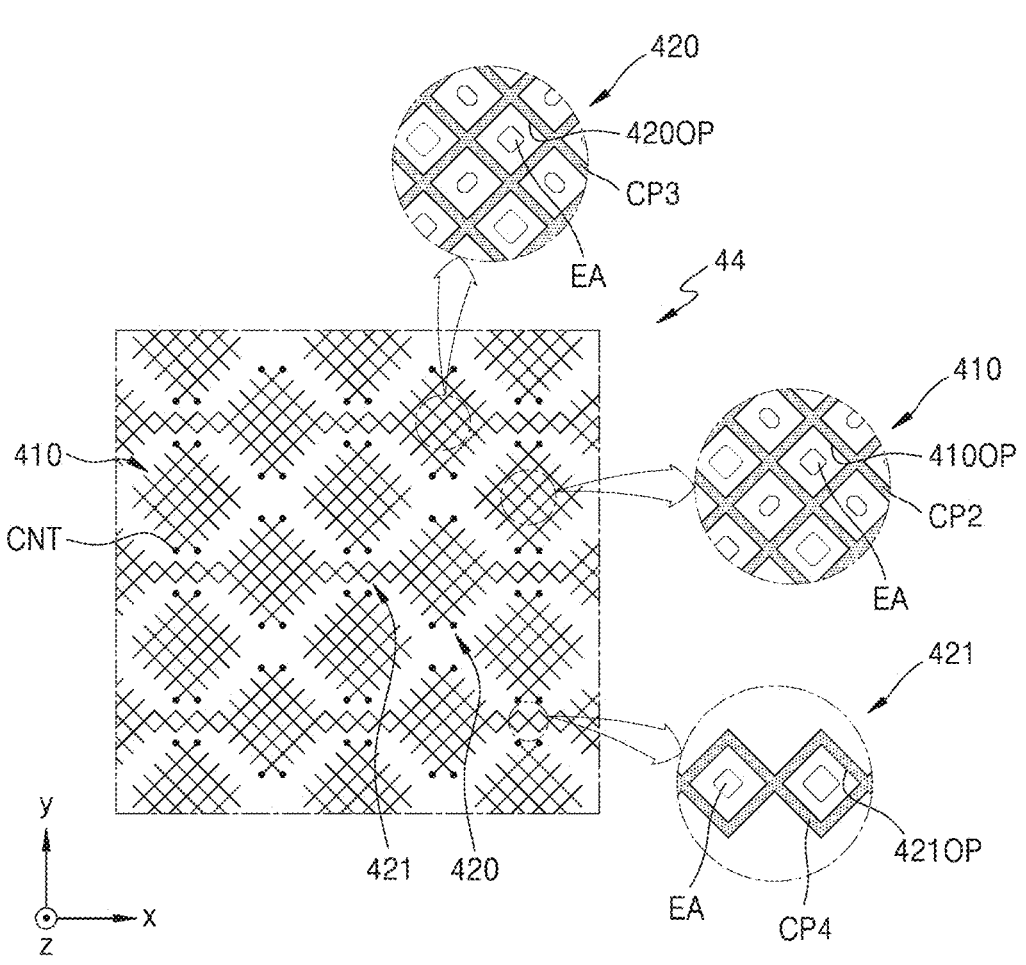
FIG. 8 is a schematic plan view of a second conductive layer in a touch sensing layer included in a display apparatus according to an embodiment.

FIG. 7 is a schematic plan view of a first conductive layer in a touch sensing layer included in a display apparatus according to an embodiment, and FIG. 8 is a schematic plan view of a second conductive layer in a touch sensing layer included in a display apparatus according to an embodiment. FIGS. 7 and 8 illustrate the first conductive layer and the second conductive layer located in the second area of the touch sensing layer, respectively.

Referring to FIGS. 7 and 8, the first and second sensing electrodes 410 and 420 and the first and second connection electrodes 411 and 421 may have mesh (or grid or lattice) patterns. In a case where the first and second sensing electrodes 410 and 420 have mesh patterns, even when the first and second sensing electrodes 410 and 420 include a metal layer, the user may be prevented from visually recognizing the metal layer, and/or light emitted from each pixel may be transmitted.

Referring to FIG. 7, the first conductive layer 42 in the touch sensing layer 40 may include the first connection electrode 411.

The first connection electrode 411 may include a first conductive pattern CP1 having a mesh pattern. The first conductive pattern CP1 may define openings 411OP surrounding an emission area EA of each of pixels in a plan view. In other words, the first conductive pattern CP1 may define the openings 411OP overlapping the emission area EA of each of the pixels in a plan view. When the pixel includes an OLED, the emission area EA may be defined by an opening of a pixel defining layer.

The first connection electrode 411 may electrically connect the first sensing electrodes 410 adjacent to each other. For example, the first connection electrode 411 may be connected to each of the first sensing electrodes 410 adjacent to each other through a contact hole CNT defined in the second sensing insulating layer 43 (FIG. 6).

Referring to FIG. 8, the second conductive layer 44 in the touch sensing layer 40 may include the first sensing electrode 410, the second sensing electrode 420, and the second connection electrode 421.

The first sensing electrode 410 may include a second conductive pattern CP2 having a mesh pattern. The second conductive pattern CP2 may define openings 4100P surrounding the emission area EA of each of the pixels in a plan view. In other words, the second conductive pattern CP2 may define the openings 4100P overlapping the emission area EA of each of the pixels.

The second sensing electrode 420 may include a third conductive pattern CP3 having a mesh pattern. The third conductive pattern CP3 may define openings 4200P surrounding the emission area EA of each of the pixels in a plan view. In other words, the third conductive pattern CP3 may define the openings 4200P overlapping the emission area EA of each of the pixels.

The second connection electrode 421 may include a fourth conductive pattern CP4 having a mesh pattern. The fourth conductive pattern CP4 may define openings 421OP surrounding the emission area EA of each of the pixels in a plan view. In other words, the fourth conductive pattern CP4 may define the openings 421OP overlapping the emission area EA of each of the pixels.

The first sensing electrodes 410 adjacent to each other may be electrically connected to each other by the first connection electrode 411 disposed in a different layer from the first sensing electrodes 410. The first sensing electrodes 410 may be connected to the first connection electrodes 411 through the contact hole CNT defined in the second sensing insulating layer 43. In other words, the second conductive patterns CP2 adjacent to each other may be electrically connected to each other by the first conductive pattern CP1. The second conductive patterns CP2 may be connected to the first conductive patterns CP1 through the contact hole CNT defined in the second sensing insulating layer 43.

The second sensing electrodes 420 adjacent to each other may be electrically connected to each other by the second connection electrode 421 disposed in the same layer as the second sensing electrodes 420. For example, the second sensing electrodes 420 may include the same material as the second connection electrodes 421, and may be formed integrally. In other words, the third conductive patterns CP3 adjacent to each other may be electrically connected to each other by the fourth conductive pattern CP4. The third conductive patterns CP3 may be integrated with the fourth conductive patterns CP4.

FIG. 9 is a schematic enlarged plan view of a portion of a first area of a display apparatus according to an embodiment. In detail, FIG. 9 illustrates display elements arranged in the first area, a first conductive pattern of a touch sensing layer, and a light blocking layer, and some members may be omitted.

Referring to FIG. 9, a plurality of first display elements DE1, a plurality of second display elements DE2, and a plurality of third display elements DE3 may be arranged in the first area AR1 of the display apparatus 1. The first display element DE1, the second display element DE2, and the third display element DE3 may implement different colors from each other. For example, the first display element DE1 may implement a blue color, the second display element DE2 may implement a red color, and the third display element DE3 may implement a green color.

Although not illustrated in FIG. 9, in the first area AR1 of the display apparatus, pixel circuits may be arranged in a matrix shape in the first direction (e.g., ±y direction) and the second direction (e.g., ±x direction). The first display element DE1, the second display element DE2, and the third display element DE3 may overlap the pixel circuits in a plan view. The first display element DE1, the second display element DE2, and the third display element DE3 may be electrically connected to the pixel circuits, respectively. Each of the first display element DE1, the second display element DE2, and the third display element DE3 may be driven by the pixel circuit electrically connected thereto. For example, the first display element DE1 may be electrically connected to a pixel circuit (e.g., a first pixel circuit PC1 illustrated in FIG. 10) through a first contact hole CNT1. The second display element DE2 may be electrically connected to a pixel circuit (e.g., a second pixel circuit PC2 illustrated in FIG. 10) through a second contact hole CNT2. The third display element DE3 may be connected to a corresponding pixel circuit through the third contact hole CNT3.

In an embodiment, the first display element DE1, the second display element DE2, and the third display element DE3 may be arranged in a pentile structure. For example, the first display element DE1 may be arranged at a first vertex and a third vertex diagonally facing each other among vertices of a virtual rectangle that has a center point of the third display element DE3 as a center point of the rectangle, and the second display element DE2 may be arranged at a second vertex and a fourth vertex, which are the remaining vertices. A size of the third display element DE3 may be smaller than the size of each of the first display element DE1 and the second display element DE2. Such a pixel arrangement structure is referred to as a pentile matrix structure or a pentile structure, wherein, by applying a rendering operation that shares adjacent pixels to express colors, a high-resolution image may be expressed with a small number of pixels.

Although FIG. 9 illustrates that the first display element DE1, the second display element DE2, and the third display element DE3 are arranged in a pentile matrix structure, the present disclosure is not limited thereto. In another embodiment, the first display element DE1, the second display element DE2, and the third display element DE3 may be arranged in various shapes such as a stripe structure, a mosaic arrangement structure, and a delta arrangement structure in a plan view.

Figure 10:
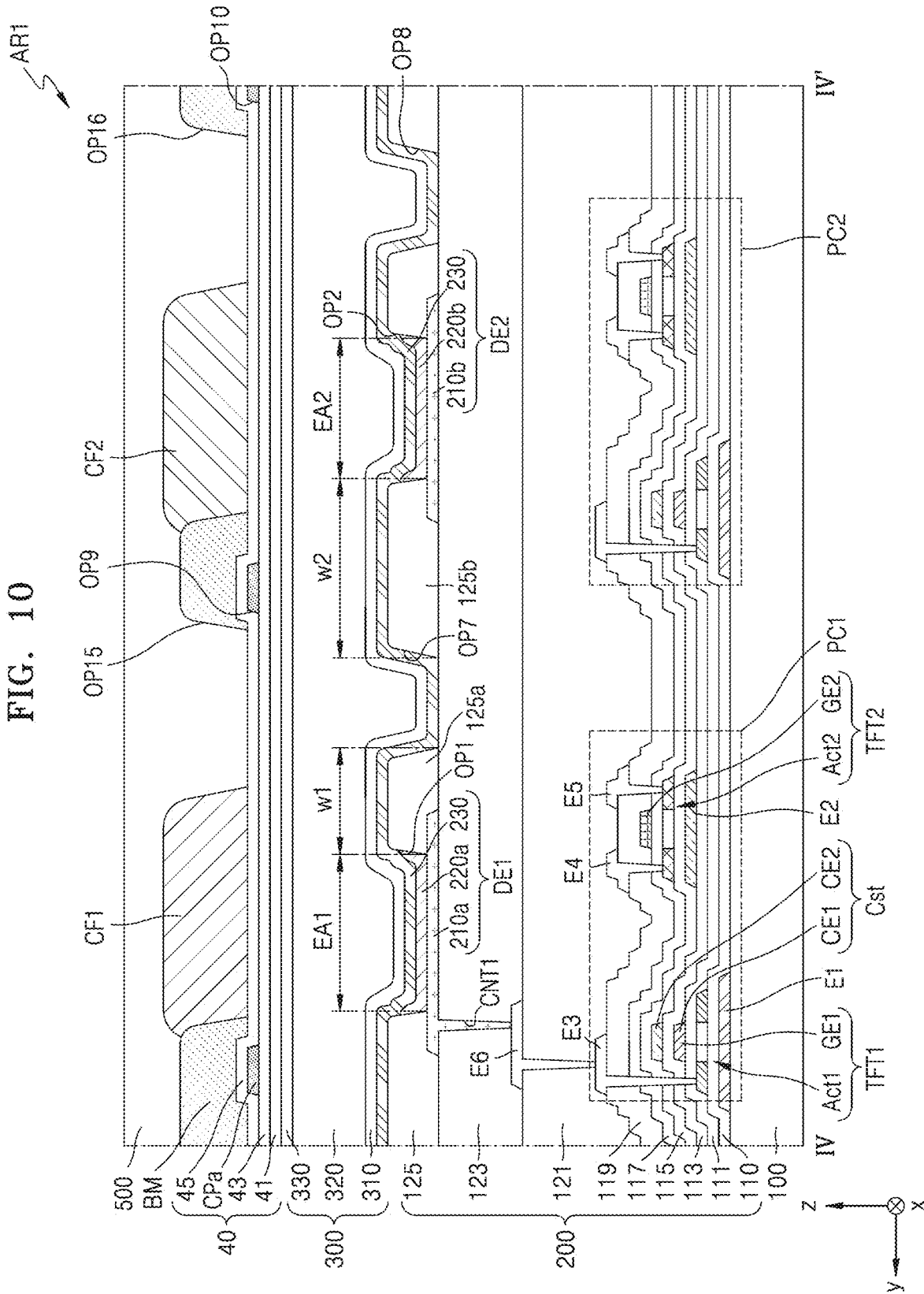
FIG. 10 is an example cross-sectional view of a region of FIG. 9, taken along line IV-IV'.

The first display element DE1 may include a first pixel electrode 210a. A first emission area EA1 of the first display element DE1 may be defined by a first opening OP1 exposing the first pixel electrode 210a. The first emission area EA1 of the first display element DE1 may correspond to the first opening OP1 exposing the first pixel electrode 210a. The first opening OP1 may be defined in a pixel defining layer 125, which is an insulating layer, as illustrated in FIG. 10 to be described below. The pixel defining layer 125 may correspond to the second insulating layer IL2 in FIG. 4.

The second display element DE2 may include a second pixel electrode 210b. A second emission area EA2 of the second display element DE2 may be defined by a second opening OP2 exposing the second pixel electrode 210b. The second emission area EA2 of the second display element DE2 may correspond to the second opening OP2 exposing the second pixel electrode 210b. The second opening OP2 may be defined in the pixel defining layer 125. The second opening OP2 may be smaller than the first opening OP1. In other words, the second emission area EA2 may be smaller than the first emission area EA1.

The third display element DE3 may include a third pixel electrode 210c. A third emission area EA3 of the third display element DE3 may be defined by a third opening OP3 exposing the third pixel electrode 210c. The third emission area EA3 of the third display element DE3 may correspond to the third opening OP3 exposing the third pixel electrode 210c. The third opening OP3 may be defined in the pixel defining layer 125. The third opening OP3 may be smaller than the second opening OP2. In other words, the third emission area EA3 may be smaller than the second emission area EA2.

FIG. 9 illustrates that each of the first opening OP1, the second opening OP2, and the third opening OP3 has a circular planar shape. However, in another embodiment, each of the first opening OP1, the second opening OP2, and the third opening OP3 may have a polygonal planar shape, such as a triangular, pentagonal, or hexagonal planar shape, a circular planar shape, an oval planar shape, an irregular planar shape, or the like in a plan view.

In an embodiment, a seventh opening OP7 may be arranged between the first opening OP1 and the second opening OP2. The seventh opening OP7 may expose a portion of a seventh insulating layer 123 (corresponding to the first insulating layer IL1 in FIG. 4) and may be defined in the pixel defining layer 125, as illustrated in FIG. 10 to be described below. As such, in addition to the openings defining the emission areas, a separate seventh opening OP7 may be defined in the first area AR1. In this case, because light and/or sound may pass through the separate seventh opening OP7, the light transmittance of the first area AR1 may be improved. The seventh opening OP7 corresponds to the auxiliary opening AOP of FIG. 3.

In an embodiment, as illustrated in FIG. 9, a first distance d1 between the first opening OP1 and the seventh opening OP7 may be less than a second distance d2 between the second opening OP2 and the seventh opening OP7.

In an embodiment, an eighth opening OP8 may be arranged between the second opening OP2 and the first opening OP1. The eighth opening OP8 may expose a portion of the seventh insulating layer 123 and may be defined in the pixel defining layer 125, as illustrated in FIG. 10 to be described below. As such, in addition to the openings defining the emission areas, a separate eighth opening OP8 may be formed in the first area AR1. In this case, because light and/or sound may pass through the separate eighth opening OP8, the light transmittance of the first area AR1 may be improved. The eighth opening OP8 corresponds to the auxiliary opening AOP of FIG. 3.

In an embodiment, as illustrated in FIG. 9, a distance between the second opening OP2 and the eighth opening OP8 may be less than a distance between the first opening OP1 and the eighth opening OP8.

The seventh opening OP7 and the eighth opening OP8 may be provided in plurality. The plurality of seventh openings OP7 and the plurality of eighth openings OP8 may each be arranged between two third display elements DE3 adjacent to each other in the second direction (e.g., ±x direction) among the plurality of third display elements DE3, and may be alternately arranged in the second direction (e.g., ±x direction). The plurality of seventh openings OP7 and the plurality of eighth openings OP8 may each be arranged between a first display element DE1 and a second display element DE2 adjacent to each other in the first direction (e.g., ±y direction) among the plurality of first display elements DE1 and the plurality of second display elements DE2, and may be alternately arranged in the first direction (e.g., ±y direction). In this case, the plurality of first display elements DE1 and the plurality of second display elements DE2 may be alternately arranged in the first direction (e.g., ±y direction).

FIG. 9 illustrates that an additional opening is not arranged between two third display elements DE3 adjacent to each other in the first direction (e.g., ±y direction). However, in another embodiment, additional openings may each be arranged between two third display elements DE3 adjacent to each other in the first direction (e.g., ±y direction).

In addition, FIG. 9 illustrates that each of the seventh opening OP7 and the eighth opening OP8 has a polygonal planar shape. However, in another embodiment, each of the seventh opening OP7 and the eighth opening OP8 may have a circular planar shape, an oval planar shape, an irregular planar shape, or the like in a plan view.

A first conductive pattern CPa may be arranged in the first area AR1 of the display apparatus 1. The first conductive pattern CPa may be included in (or correspond to) one of the first sensing electrodes 410, the first connection electrodes 411, the second sensing electrodes 420, and the second connection electrodes 421 illustrated in FIG. 5. The first conductive pattern CPa may define a ninth opening OP9 overlapping the first opening OP1 and the seventh opening OP7, a tenth opening OP10 overlapping the second opening OP2 and the eighth opening OP8, and an eleventh opening OP11 overlapping the third opening OP3. The ninth opening OP9, the tenth opening OP10, and the eleventh opening OP11 may expose a portion of an insulating layer arranged under the first conductive pattern CPa, as illustrated in FIG. 10 to be described below. The first conductive pattern CPa corresponds to the first mesh pattern MP1 of FIG. 3, and the ninth to eleventh openings OP9, OP10, and OP11 correspond to the first hole H1, the third hole H3, and the fifth hole H5 of FIG. 3, respectively.

In a plan view, the ninth opening OP9 may have a closed loop shape surrounding the first opening OP1 and the seventh opening OP7, the tenth opening OP10 may have a closed loop shape surrounding the second opening OP2 and the eighth opening OP8, and the eleventh opening OP11 may have a closed loop shape surrounding the third opening OP3 in a plan view.

As such, because the seventh opening OP7 and the eighth opening OP8 do not overlap the first conductive pattern CPa in a plan view, light and/or sound may be transmitted through the seventh opening OP7 and the eighth opening OP8.

In an embodiment, the ninth opening OP9, the tenth opening OP10, and the eleventh opening OP11 may have a polygonal shape in a plan view. The number of sides of each of the ninth opening OP9, the tenth opening OP10, and the eleventh opening OP11 may be 5 or more. For example, as illustrated in FIG. 9, the number of first sides ed1 of the ninth opening OP9 may be 10, the number of second sides ed2 of the tenth opening OP10 may be 10, and the number of third sides ed3 of the eleventh opening OP11 may be 6. This is only an example, and the numbers of sides of the ninth to eleventh openings OP9, OP10, and OP11 may be variously modified.

The ninth opening OP9, the tenth opening OP10, and the eleventh opening OP11 may be provided in plurality. The plurality of ninth openings OP9 and the plurality of tenth openings OP10 may be alternately arranged in the first direction (e.g., ±y direction) and the second direction (e.g., ±x direction). The plurality of eleventh openings OP11 may be arranged in the first direction (e.g., ±y direction) and the second direction (e.g., ±x direction). The plurality of ninth openings OP9 and the plurality of eleventh openings OP11 may be alternately arranged in a third direction (e.g., a diagonal direction). The plurality of tenth openings OP10 and the plurality of eleventh openings OP11 may be alternately arranged in a fourth direction (e.g., a diagonal direction) crossing the third direction.

The light blocking layer BM may be arranged in the first area AR1 of the display apparatus 1. The light blocking layer BM may define a fifteenth opening OP15 overlapping the first opening OP1 and the seventh opening OP7, a sixteenth opening OP16 overlapping the second opening OP2 and the eighth opening OP8, and a seventeenth opening OP17 overlapping the third opening OP3 in a plan view. As illustrated in FIG. 10 to be described below, the light blocking layer BM may be arranged on the first conductive pattern CPa, and the fifteenth opening OP15, the sixteenth opening OP16, and the seventeenth opening OP17 may expose a portion of an insulating layer arranged between the first conductive pattern CPa and the light blocking layer BM.

In a plan view, the fifteenth opening OP15 may have a closed loop shape surrounding the first opening OP1 and the seventh opening OP7, the sixteenth opening OP16 may have a closed loop shape surrounding the second opening OP2 and the eighth opening OP8, and the seventeenth opening OP17 may have a closed loop shape surrounding the third opening OP3 in a plan view. The fifteenth opening OP15 may be surrounded by the ninth opening OP9, the sixteenth opening OP16 may be surrounded by the tenth opening OP10, and the seventeenth opening OP17 may be surrounded by the eleventh opening OP11. In other words, the fifteenth opening OP15 may be smaller than the ninth opening OP9, the sixteenth opening OP16 may be smaller than the tenth opening OP10, and the seventeenth opening OP17 may be smaller than the eleventh opening OP11.

As such, because the seventh opening OP7 and the eighth opening OP8 do not overlap the light blocking layer BM in a plan view, light and/or sound may be transmitted through the seventh opening OP7 and the eighth opening OP8.

In an embodiment, the seventeenth opening OP17 may have a circular planar shape. Each of the fifteenth opening OP15 and the sixteenth opening OP16 may not have a circular planar shape. For example, as illustrated in FIG. 9, each of the fifteenth opening OP15 and the sixteenth opening OP16 may have a keyhole shape in a plan view.

The fifteenth opening OP15, the sixteenth opening OP16, and the seventeenth opening OP17 may be provided in plurality. The plurality of fifteenth openings OP15 and the plurality of sixteenth openings OP16 may be alternately arranged in the first direction (e.g., ±y direction) and the second direction (e.g., ±x direction). The plurality of seventeenth openings OP17 may be arranged in the first direction (e.g., ±y direction) and the second direction (e.g., ±x direction). The plurality of fifteenth openings OP15 and the plurality of seventeenth openings OP17 may be alternately arranged in the third direction (e.g., the diagonal direction). The plurality of tenth openings OP10 and the plurality of eleventh openings OP11 may be alternately arranged in the fourth direction (e.g., the diagonal direction) crossing the third direction.

FIG. 10 is an example cross-sectional view of a region of FIG. 9, taken along line IV-IV'. FIG. 10 is an example cross-sectional view, and some members may be omitted.

Referring to FIG. 10, the first display element DE1 and the second display element DE2 may be arranged on the seventh insulating layer 123. The first display element DE1 may include the first pixel electrode 210a, a first interlayer 220a, and the opposite electrode 230, and the second display element DE2 may include the second pixel electrode 210b, a second interlayer 220b, and the opposite electrode 230.

The first pixel electrode 210a may be electrically connected to the first pixel circuit PC1 through the first contact hole CNT1. The first pixel circuit PC1 may include at least one transistor and at least one capacitor. For example, the first pixel circuit PC1 may include a first transistor TFT1, a second transistor TFT2, and a storage capacitor Cst. Although not illustrated in FIG. 10, as described above with reference to FIG. 9, the second pixel electrode 210b may be electrically connected to the second pixel circuit PC2 including at least one transistor and at least one capacitor through the second contact hole CNT2.

The pixel defining layer 125 may be arranged on the first pixel electrode 210a and the second pixel electrode 210b arranged apart from each other. The pixel defining layer 125 may define the first opening OP1 exposing the first pixel electrode 210a, the second opening OP2 exposing the second pixel electrode 210b, and the seventh opening OP7 located between the first opening OP1 and the second opening OP2. The seventh opening OP7 may expose a portion of the seventh insulating layer 123. A portion of the opposite electrode 230 arranged on the pixel defining layer 125 may be buried in the seventh opening OP7 to be in contact with the portion of the seventh insulating layer 123.

Although not illustrated in FIG. 10, as described above with reference to FIG. 9, because the first display elements DE1 and the second display elements DE2 may be alternately arranged in the first direction (e.g., ±y direction), the first display element DE1 may be arranged on one side (a −y direction side) of the second display element DE2. The pixel defining layer 125 may define the eighth opening OP8 located between the second opening OP2 and the first opening OP1. The eighth opening OP8 may expose another portion of the seventh insulating layer 123. Another portion of the opposite electrode 230 arranged on the pixel defining layer 125 may be buried in the eighth opening OP8 to be in contact the other portion of the seventh insulating layer 123.

In an embodiment, a first width w1 of a first portion 125a of the pixel defining layer 125 may be smaller than a second width w2 of a second portion 125b of the pixel defining layer 125 in the first direction (e.g., ±y direction). The first portion 125a of the pixel defining layer 125 may be located between the first opening OP1 and the seventh opening OP7, and the second portion 125b of the pixel defining layer 125 may be located between the second opening OP2 and the seventh opening OP7.

In other words, as described above with reference to FIG. 9, the first distance d1 between the first opening OP1 and the seventh opening OP7 may be less than the second distance d2 between the second opening OP2 and the seventh opening OP7. In addition, as the seventh opening OP7 is arranged closer to the first opening OP1 than the second opening OP2, the eighth opening OP8 may be arranged closer to the second opening OP2 than the first opening OP1.

The touch sensing layer 40 may be arranged on the first display element DE1 and the second display element DE2. The touch sensing layer 40 may include the first sensing insulating layer 41, the second sensing insulating layer 43 on the first sensing insulating layer 41, the first conductive pattern CPa on the second sensing insulating layer 43, and the third sensing insulating layer 45 on the first conductive pattern CPa.

FIG. 10 illustrates that the first conductive pattern CPa is arranged between the second sensing insulating layer 43 and the third sensing insulating layer 45. However, in another embodiment, the first conductive pattern CPa may be arranged between the first sensing insulating layer 41 and the second sensing insulating layer 43.

The first conductive pattern CPa may define the ninth opening OP9 overlapping the first opening OP1 and the seventh opening OP7, and the tenth opening OP10 overlapping the second opening OP2 and the eighth opening OP8. The ninth opening OP9 and the tenth opening OP10 may expose a portion of the second sensing insulating layer 43 arranged under the first conductive pattern CPa.

The light blocking layer BM may be arranged on the touch sensing layer 40. The light blocking layer BM may define the fifteenth opening OP15 overlapping the first opening OP1 and the seventh opening OP7, and the sixteenth opening OP16 overlapping the second opening OP2 and the eighth opening OP8. The fifteenth opening OP15 and the sixteenth opening OP16 may expose a portion of the third sensing insulating layer 45 arranged between the first conductive pattern CPa and the light blocking layer BM.

At least a portion of a first color filter layer CF1 may be arranged in the fifteenth opening OP15 of the light blocking layer BM, and at least a portion of a second color filter layer CF2 may be arranged in the sixteenth opening OP16 of the light blocking layer BM. The first color filter layer CF1 and the second color filter layer CF2 may correspond to the first color filter layer CFa and the second color filter layer CFb of FIG. 4, respectively. The first color filter layer CF1 and the second color filter layer CF2 may transmit light of different wavelength bands. For example, the first color filter layer CF1 may transmit only light of a wavelength ranging from about 450 nanometers (nm) to about 495 nm, and the second color filter layer CF2 may transmit only light of a wavelength ranging from about 630 nm to about 780 nm.

In an embodiment, the first color filter layer CF1 may partially contact a portion of the third sensing insulating layer 45 exposed by the fifteenth opening OP15 of the light blocking layer BM. The second color filter layer CF2 may partially contact a portion of the third sensing insulating layer 45 exposed by the sixteenth opening OP16 of the light blocking layer BM.

For example, as illustrated in FIG. 10, the first color filter layer CF1 may be arranged to overlap the first opening OP1 of the pixel defining layer 125 and not to overlap the seventh opening OP7 of the pixel defining layer 125 in a plan view. The second color filter layer CF2 may be arranged to overlap the second opening OP2 of the pixel defining layer 125 and not to overlap the eighth opening OP8 of the pixel defining layer 125. The light transmittance of the first area AR1 may be improved by the separate seventh and eighth openings OP7 and OP8 defined in the pixel defining layer 125. When a color filter layer is not arranged on the seventh opening OP7 and the eighth opening OP8, the light transmittance of the first area AR1 may be further improved.

Although not illustrated in FIG. 10, as described above with reference to FIG. 9, the light blocking layer BM may define the seventeenth opening OP17 overlapping the third opening OP3 defining the third emission area EA3 of the third display element DE3. The seventeenth opening OP17 may expose a portion of the third sensing insulating layer 45 arranged between the first conductive pattern CPa and the light blocking layer BM. At least a portion of a color filter layer may be arranged in the seventeenth opening OP17 of the light blocking layer BM. In this case, the color filter layer of which at least a portion is arranged in the seventeenth opening OP17 may transmit only light of a wavelength ranging from about 495 nm to about 570 nm. When an additional opening is not arranged between two third display elements DE3 adjacent to each other in the first direction (e.g., ±y direction), the color filter layer of which at least a portion is arranged in the seventeenth opening OP17 may be in contact with a portion of the third sensing insulating layer 45 exposed by the seventeenth opening OP17.

Hereinafter, components included in the display apparatus will be described in more detail according to a stacked structure with reference to FIG. 10.

The substrate 100 may include a glass material, a ceramic material, a metal material, or a flexible or bendable material. When the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single-layered or a multi-layered structure of the materials described above, and when the substrate 100 has a multi-layered structure, the substrate 100 may further include an inorganic material. In some embodiments, the substrate 100 may have a structure of an organic material/an inorganic material/an organic material.

The display layer 200 may be arranged on the substrate 100. The display layer 200 may include pixel circuits including at least one transistor and at least one capacitor, insulating layers, electrodes, and display elements.

A buffer layer 110 may reduce or block penetration of foreign substances, moisture, or external air from below the substrate 100, and may provide a flat surface on the substrate 100. The buffer layer 110 may include an inorganic material such as an oxide or a nitride, an organic material, or an organic-inorganic composite material, and may have a single-layered structure or a multi-layered structure of an inorganic material and an organic material.

A barrier layer (not shown) may further be included between the substrate 100 and the buffer layer 110. The barrier layer may prevent or reduce penetration of impurities from the substrate 100, etc. into a first semiconductor layer Act1 and a second semiconductor layer Act2. The barrier layer may include an inorganic material such as an oxide or a nitride, an organic material, or an organic-inorganic composite material, and may have a single-layered structure or a multi-layered structure of an inorganic material and an organic material.

A first electrode E1 may be arranged between the substrate 100 and the buffer layer 110. The first electrode E1 may include a conductive material including Mo, Al, Cu, Ti, or the like, and may include a single layer or multiple layers including the above materials.

The first electrode E1 may at least partially overlap the first semiconductor layer Act1 in a plan view. The first electrode E1 may protect the first semiconductor layer Act1. The first electrode E1 may be configured such that a certain (or preset) voltage is applied thereto. When a pixel circuit including both an n-channel metal-oxide-semiconductor field-effect transistor ("MOSFET") ("NMOS") and a p-channel MOSFET ("PMOS") is driven through the first electrode E1 to which a certain voltage is applied, unnecessary charges may be prevented from being accumulated in the first semiconductor layer Act1. As a result, characteristics of the first transistor TFT1 including the first semiconductor layer Act1 may be stably maintained.

The first semiconductor layer Act1 may be arranged on the buffer layer 110. The first semiconductor layer Act1 may include amorphous silicon or polysilicon. The first semiconductor layer Act1 may include a channel area and a source area and a drain area arranged on both sides of the channel area. The source area and the drain area may be doped with a dopant. The first semiconductor layer Act1 may include a single layer or multiple layers.

A first insulating layer 111 and a second insulating layer 113 may be stacked on the substrate 100 to cover the first semiconductor layer Act1. The first insulating layer 111 and the second insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) and/or zinc peroxide ($ZnO_2$).

A first gate electrode GE1 may be arranged on the first insulating layer 111. The first gate electrode GE1 may be arranged to at least partially overlap the first semiconductor layer Act1 in a plan view. The first gate electrode GE1 may include a conductive material including Mo, Al, Cu, Ti, or the like, and may include a single layer or multiple layers including the above materials. For example, the first gate electrode GE1 may be a single layer of Mo.

An upper electrode CE2 and a second electrode E2 may be arranged on the second insulating layer 113. The upper electrode CE2 and the second electrode E2 may include a conductive material including Mo, Al, Cu, Ti, or the like, and may include a single layer or multiple layers including the above materials. For example, the upper electrode CE2 and the second electrode E2 may be single layers of Mo.

In an embodiment, the storage capacitor Cst may include a lower electrode CE1 and the upper electrode CE2, and may overlap the first transistor TFT1 in a plan view, as illustrated in FIG. 10. For example, the first gate electrode GE1 of the first transistor TFT1 may function as the lower electrode CE1 of the storage capacitor Cst. Alternatively, the storage capacitor Cst may not overlap the first transistor TFT1 in a plan view, and may be separately provided.

The upper electrode CE2 of the storage capacitor Cst overlaps the lower electrode CE1 with the second insulating layer 113 therebetween to form a capacitance. In this case, the second insulating layer 113 may function as a dielectric layer of the storage capacitor Cst.

The second electrode E2 may at least partially overlap the second semiconductor layer Act2 of the second transistor TFT2 in a plan view. The second electrode E2 may protect the second semiconductor layer Act2. The second electrode E2 may be configured such that a certain (or preset) voltage is applied thereto. For example, the second electrode E2 may be electrically connected to a second gate electrode GE2 to be described below. The second electrode E2 may be substantially synchronized with the second gate electrode GE2.

A third insulating layer 115 may be arranged on the second insulating layer 113 to cover the upper electrode CE2 and the second electrode E2. The third insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) and/or zinc peroxide ($ZnO_2$).

The second semiconductor layer Act2 may be arranged on the third insulating layer 115. The second semiconductor layer Act2 may include an oxide semiconductor material. The second semiconductor layer Act2 may include, for example, an oxide of at least one material selected from the group consisting of In, Ga, Sn, Zr, V, Hf, Cd, Ge, Cr, Ti, Al, Cs, Ce, and Zn.

For example, the second semiconductor layer Act2 may be an InSnZnO (ITZO) semiconductor layer, an InGaZnO ("IGZO") semiconductor layer, or the like. Because an oxide semiconductor has a wide band gap (about 3.1 electronvolts (eV)), high carrier mobility, and low leakage current, even when a driving time is long, a voltage drop may not be large, and thus, even in a low frequency operation, a luminance change due to the voltage drop may not be large.

The second semiconductor layer Act2 may include a channel area and a source area and a drain area arranged on both sides of the channel area. The second semiconductor layer Act2 may include a single layer or multiple layers.

As described above, the second electrode E2 may be arranged under the second semiconductor layer Act2. Because the second semiconductor layer Act2 including the oxide semiconductor material is vulnerable to light, the second semiconductor layer Act2 may be protected by the second electrode E2. The second electrode E2 may prevent characteristics of the second transistor TFT2 including the oxide semiconductor material from being changed by a photocurrent generated in the second semiconductor layer Act2 due to external light incident from a side of the substrate 100.

A fourth insulating layer 117 may be arranged on the third insulating layer 115 to cover the second semiconductor layer Act2. The fourth insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) and/or zinc peroxide ($ZnO_2$).

FIG. 10 illustrates that the fourth insulating layer 117 is arranged over the entire surface of the substrate 100 to cover the second semiconductor layer Act2. However, in another embodiment, the fourth insulating layer 117 may be patterned to overlap a portion of the second semiconductor layer Act2. For example, the fourth insulating layer 117 may be patterned to overlap the channel area of the second semiconductor layer Act2 in a plan view.

The second gate electrode GE2 may be arranged on the fourth insulating layer 117. The second gate electrode GE2 may be arranged to at least partially overlap the second semiconductor layer Act2. The second gate electrode GE2 may include a conductive material including Mo, Al, Cu, Ti, or the like, and may include a single layer or multiple layers including the above materials. For example, the second gate electrode GE2 may be a single layer of Mo.

FIG. 10 illustrates that the first transistor TFT1 and the second transistor TFT2 are arranged on different layers. However, in another embodiment, the first transistor TFT1 and the second transistor TFT2 may be arranged on the same layer. For example, the second semiconductor layer Act2 of the second transistor TFT2 may be arranged between the buffer layer 110 and the first insulating layer 111, and the second gate electrode GE2 may be arranged between the first insulating layer 111 and the second insulating layer 113. In this case, the first semiconductor layer Act1 of the first transistor TFT1 and the second semiconductor layer Act2 of the second transistor TFT2 may include the same material. In addition, some insulating layers may be omitted.

A fifth insulating layer 119 may be arranged on the fourth insulating layer 117 to cover the second gate electrode GE2. The fifth insulating layer 119 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may be zinc oxide (ZnO) and/or zinc peroxide ($ZnO_2$).

A third electrode E3, a fourth electrode E4, and a fifth electrode E5 may be arranged on the fifth insulating layer 119. The third electrode E3, the fourth electrode E4, and the fifth electrode E5 may include a conductive material including Mo, Al, Cu, Ti, or the like, and may include multiple layers or a single layer including the above materials. For example, the third electrode E3, the fourth electrode E4, and the fifth electrode E5 may have a multi-layered structure of Ti/Al/Ti.

The third electrode E3 may be connected to the first semiconductor layer Act1 through contact holes defined in the first to fifth insulating layers 111, 113, 115, 117, and 119. A portion of the third electrode E3 may be buried in the contact holes, and the third electrode E3 and the first semiconductor layer Act1 may be connected to each other. The fourth electrode E4 may be connected to the second semiconductor layer Act2 through contact holes defined in the fourth and fifth insulating layers 117 and 119. A portion of the fourth electrode E4 may be buried in the contact holes, and the fourth electrode E4 and the second semiconductor layer Act2 may be connected to each other. The fifth electrode E5 may be connected to the second semiconductor layer Act2 through contact holes defined in the fourth and fifth insulating layers 117 and 119. A portion of the fifth electrode E5 may be buried in the contact holes, and the fifth electrode E5 and the second semiconductor layer Act2 may be connected to each other.

FIG. 10 illustrates that the third electrode E3, the fourth electrode E4, and the fifth electrode E5 are arranged on the fifth insulating layer 119. However, in another embodiment, one of the fourth electrode E4 and the fifth electrode E5 may be omitted.

A sixth insulating layer 121 and a seventh insulating layer 123 may be stacked on the fifth insulating layer 119. The sixth insulating layer 121 and the seventh insulating layer 123 may include a single layer or multiple layers including an organic material, and may provide a flat upper surface. The sixth insulating layer 121 and the seventh insulating layer 123 may include a general purpose polymer such as benzocyclobutene ("BCB"), polyimide, hexamethyldisiloxane ("HMDSO"), polymethylmethacrylate ("PMMA"), or polystyrene ("PS"), a polymer derivative including a phenolic group, an acrylic polymer, an imide-based polymer, an aryl ether-based polymer, an amide-based polymer, a fluorine-based polymer, a p-xylene-based polymer, a vinyl alcohol-based polymer, or a blend thereof.

A sixth electrode E6 may be arranged on the sixth insulating layer 121. The sixth electrode E6 may include a conductive material including Mo, Al, Cu, Ti, or the like, and may include a single layer or multiple layers including the above materials. For example, the sixth electrode E6 may have a multi-layered structure of Ti/Al/Ti.

The sixth electrode E6 may be connected to the third electrode E3 through a contact hole defined in the sixth insulating layer 121. A portion of the sixth electrode E6 may be buried in the contact hole, and the sixth electrode E6 and the third electrode E3 may be connected to each other. The sixth electrode E6 may be connected to the first semiconductor layer Act1 through the third electrode E3.

The first display element DE1 and the second display element DE2 may be arranged on the seventh insulating layer 123. The first display element DE1 may include the first pixel electrode 210a, the first interlayer 220a, and the opposite electrode 230, and the second display element DE2 may include the second pixel electrode 210b, the second interlayer 220b, and the opposite electrode 230.

The first pixel electrode 210a and the second pixel electrode 210b may be a (semi-)transmissive electrode or a reflective electrode. In some embodiments, the first pixel electrode 210a and the second pixel electrode 210b may include a reflective layer including Ag, Mg, Al, Pt, Pd, Au, Ni, Nd, Ir, Cr, and a compound thereof, and a transparent or semi-transparent electrode layer disposed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide ("IGO"), and aluminum zinc oxide ("AZO"). In some embodiments, the first pixel electrode 210a and the second pixel electrode 210b may include ITO/Ag/ITO.

The first pixel electrode 210a may be connected to the sixth electrode E6 through the first contact hole CNT1 defined in the seventh insulating layer 123. A portion of the first pixel electrode 210a may be buried in the first contact hole CNT1, and the first pixel electrode 210a and the sixth electrode E6 may be connected to each other. The first pixel electrode 210a may be electrically connected to the first semiconductor layer Act1 through the sixth electrode E6 and the third electrode E3. Although the descriptions are given with respect to the first pixel electrode 210a, the same may be likewise applied to the second pixel electrode 210b.

The pixel defining layer 125 may be arranged on the seventh insulating layer 123. In addition, the pixel defining layer 125 may increase a distance between an edge of each of the first pixel electrode 210a and the second pixel electrode 210b and the counter electrode 230 above each of the first pixel electrode 210a and the second pixel electrode 210b, and thus may prevent an arc or the like from occurring at the edge of each of the first pixel electrode 210a and the second pixel electrode 210b.

The pixel defining layer 125 may include at least one organic insulating material selected from the group consisting of polyimide, polyamide, acrylic resin, benzocyclobutene, and phenolic resin, and may be formed by spin coating or the like. The pixel defining layer 125 may include an organic insulating material. Alternatively, the pixel defining layer 125 may include an inorganic insulating material such as silicon nitride, silicon oxynitride, or silicon oxide. Alternatively, the pixel defining layer 125 may include an organic insulating material and an inorganic insulating material. In some embodiments, the pixel defining layer 125 may include a light blocking material, and may have a black color. The light blocking material may include resins or pastes containing carbon black, carbon nanotubes, or black dye, metal particles such as nickel, aluminum, molybdenum, and alloys thereof, metal oxide particles (e.g., chromium oxide), or metal nitride particles (e.g., chromium nitride). When the pixel defining layer 125 includes the light blocking material, reflection of external light due to metal structures arranged under the pixel defining layer 125 may be reduced.

The first interlayer 220a may be arranged in the first opening OP1 defined by the pixel defining layer 125, and the second interlayer 220b may be arranged in the second opening OP2 defined by the pixel defining layer 125. The first interlayer 220a and the second interlayer 220b may include an organic emission layer. The organic emission layer may include an organic material including a fluorescent or phosphorescent material emitting red, green, blue, or white light. For example, the first interlayer 220a may include an organic material including a fluorescent or phosphorescent material emitting blue light, and the second interlayer 220b may include an organic material including a fluorescent or phosphorescent material emitting red light. The organic emission layer may include a low molecular-weight organic material or a high molecular-weight organic material. Also, a functional layer, such as a hole transport layer ("HTL"), a hole injection layer ("HIL"), an electron transport layer ("ETL"), or an electron injection layer ("EIL"), may be selectively further arranged above and below the organic emission layer.

The first interlayer 220a may be arranged to correspond to each of a plurality of first pixel electrodes 210a. However, the first interlayer 220a is not limited thereto. The first interlayer 220a may have various modifications. For example, the first interlayer 220a may include a single layer over the plurality of first pixel electrodes 210a. The above descriptions may be applied to the second interlayer 220b.

The opposite electrode 230 may be a transparent electrode or a reflective electrode. In some embodiments, the opposite electrode 230 may be a transparent electrode or semi-transparent electrode, and may include a metal thin-film having a small work function, including Li, Ca, LiF/Ca, LiF/Al, Al, Ag, Mg, and a compound thereof. In addition, a transparent conductive oxide ("TCO") layer, including ITO, IZO, ZnO, or $In_2O_3$ may further be arranged on the metal thin-film. The opposite electrode 230 may be arranged over the display area, and may be arranged on the first and second interlayers 220a and 220b and the pixel defining layer 125. The opposite electrode 230 may be integrally formed with a plurality of display elements, and may correspond to a plurality of pixel electrodes.

Because the display elements including the organic emission layer may be easily damaged by external moisture, oxygen, or the like, the encapsulation layer 300 may cover and protect the display elements. The encapsulation layer 300 may be arranged on the opposite electrode 230, may cover the display area, and may extend to at least a portion of the peripheral area. The encapsulation layer 300 may include at least one inorganic encapsulation layer and/or at least one organic encapsulation layer. For example, as illustrated in FIG. 10, the encapsulation layer 300 may include a first inorganic encapsulation layer 310, an organic encapsulation layer 320, and a second inorganic encapsulation layer 330. The first inorganic encapsulation layer 310 and the second inorganic encapsulation layer 330 may include at least one inorganic insulating material selected from aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and polyethylene. In an embodiment, the organic encapsulation layer 320 may include acrylate.

The touch sensing layer 40 may be arranged on the encapsulation layer 300. The touch sensing layer 40 may include the first sensing insulating layer 41, the second sensing insulating layer 43 on the first sensing insulating layer 41, the first conductive pattern CPa on the second sensing insulating layer 43, and the third sensing insulating layer 45 on the first conductive pattern CPa. The first sensing insulating layer 41, the second sensing insulating layer 43, and the third sensing insulating layer 45 may each include an inorganic insulating material and/or an organic insulating material. The inorganic insulating material may include silicon oxide, silicon nitride, or silicon oxynitride, and the organic insulating material may include a high-molecular weight organic material. The first conductive pattern CPa may include a metal layer or a transparent conductive layer. The metal layer may include Mo, Mb, Ag, Ti, Cu, Al, or an alloy thereof. The transparent conductive layer may include a transparent conductive oxide such as ITO, IZO, ZnO, and/or ITZO. In addition, the transparent conductive layer may include a conductive polymer such as PEDOT, metal nanowires, graphene, and/or the like.

The light blocking layer BM may be arranged on the touch sensing layer 40. The light blocking layer BM, which is a black matrix, may be a layer for improving color sharpness and contrast. The light blocking layer BM may include at least one of a black pigment, a black dye, and black particles. In some embodiments, the light blocking layer BM may include a material such as Cr or $CrO_X$, $Cr/CrO_X$, $Cr/CrOX/CrN_Y$, resin (e.g., a carbon pigment or an RGB mixed pigment), graphite, or a non-Cr-based material. Alternatively, the light blocking layer BM may include a light blocking material, and may have a black color. The light blocking material may include resins or pastes containing carbon black, carbon nanotubes, or black dye, metal particles such as nickel, aluminum, molybdenum, and alloys thereof, metal oxide particles (e.g., chromium oxide), or metal nitride particles (e.g., chromium nitride). When the light blocking layer BM includes the light blocking material, external light reflection due to metal structures arranged under the light blocking layer BM may be reduced.

The first color filter layer CF1, at least a portion of which is arranged in the fifteenth opening OP15 of the light blocking layer BM, may transmit only light of a wavelength ranging from about 450 nm to about 495 nm. The second color filter layer CF2, at least a portion of which is arranged in the sixteenth opening OP16 of the light blocking layer BM, may transmit only light of a wavelength ranging from about 630 nm to about 780 nm. The first color filter layer CF1 and the second color filter layer CF2 may reduce reflection of external light in the display apparatus 1. For example, when external light reaches the first color filter layer CF1, only light of a preset wavelength passes through the first color filter layer CF1, and light of other wavelengths is absorbed by the first color filter layer CF1. Accordingly, only the light of the preset wavelength among the external light incident on the display apparatus passes through the first color filter layer CF1, and some of the external light is reflected by the opposite electrode 230 or the first pixel electrode 210a below the first color filter layer CF1 to be emitted back to the outside. As a result, because only some of the external light incident on where a pixel is located is reflected to the outside, external light reflection may be reduced. The above descriptions may be applied to the second color filter layer CF2.

A planarization layer 500 may be arranged on the light blocking layer BM, the first color filter layer CF1, and the second color filter layer CF2. The planarization layer 500 may have a flat top surface. In an embodiment, the planarization layer 500 may include an organic material. For example, the planarization layer 500 may include a polymer-based material. The polymer-based material may be transparent. For example, the planarization layer 500 may include a silicon-based resin, an acrylic resin, an epoxy-based resin, polyimide, and polyethylene.

Figure 11:
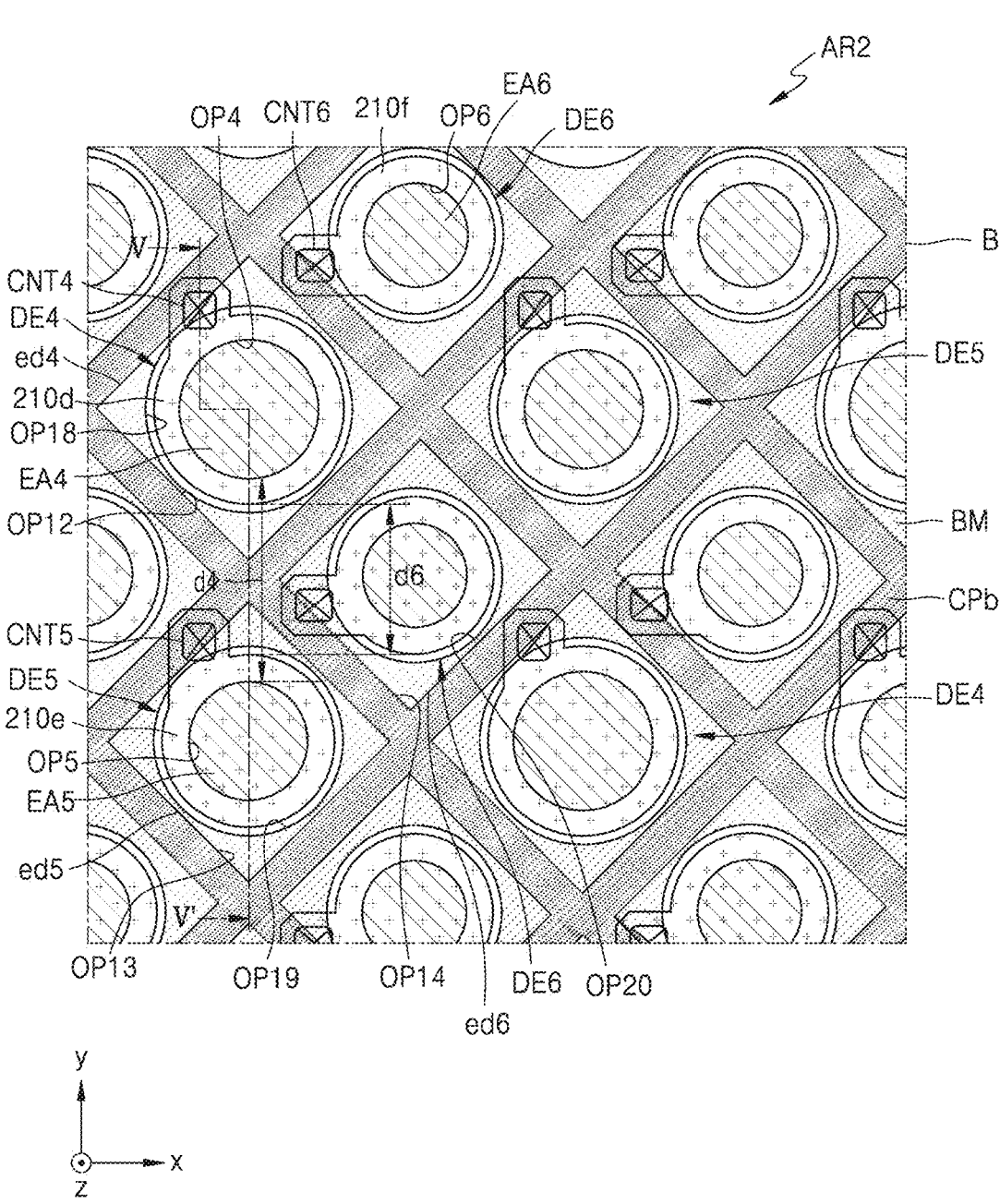
FIG. 11 is a schematic enlarged plan view of a portion of a second area of a display apparatus according to an embodiment.

FIG. 11 is a schematic enlarged plan view of a portion of a second area of a display apparatus according to an embodiment. In detail, FIG. 11 illustrates display elements arranged in the second area, a second conductive pattern of a touch sensing layer, and a light blocking layer, and some members may be omitted.

Referring to FIG. 11, a plurality of fourth display elements DE4, a plurality of fifth display elements DE5, and a plurality of sixth display elements DE6 may be arranged in the second area AR2 of the display apparatus 1. The fourth display element DE4, the fifth display element DE5, and the sixth display element DE6 may implement different colors. For example, the fourth display element DE4 may implement a blue color, the fifth display element DE5 may implement a red color, and the sixth display element DE6 may implement a green color.

Although not illustrated in FIG. 11, in the second area AR2 of the display apparatus, pixel circuits may be arranged in a matrix shape in the first direction (e.g., ±y direction) and the second direction (e.g., ±x direction). The fourth display element DE4, the fifth display element DE5, and the sixth display element DE6 may overlap the pixel circuits in a plan view. The fourth display element DE4, the fifth display element DE5, and the sixth display element DE6 may be electrically connected to the pixel circuits, respectively. Each of the fourth display element DE4, the fifth display element DE5, and the sixth display element DE6 may be driven by the pixel circuit electrically connected thereto. For example, the fourth display element DE4 may be electrically connected to a pixel circuit (e.g., a fourth pixel circuit PC4 illustrated in FIG. 12) through a fourth contact hole CNT4. The fifth display element DE5 may be electrically connected to a pixel circuit (e.g., a fifth pixel circuit PC5 illustrated in FIG. 12) through a fifth contact hole CNT5. The sixth display element DE6 may be connected to a pixel circuit through a sixth contact hole CNT6.

The fourth display element DE4, the fifth display element DE5, and the sixth display element DE6 arranged in the second area AR2 may be arranged in the same structure as the first display element DE1, the second display element DE2, and the third display element DE3 arranged in the first area AR1. For example, the fourth display element DE4, the fifth display element DE5, and the sixth display element DE6 may be arranged in a pentile structure. For example, the fourth display element DE4 may be arranged at a first vertex and a third vertex facing each other among vertices of a virtual rectangle that has a center point of the sixth display element DE6 as a center point of the rectangle, and the fifth display element DE5 may be arranged at a second vertex and a fourth vertex, which are the remaining vertices. A size of the sixth display element DE6 may be smaller than those of the fourth display element DE4 and the fifth display element DE5.

Although FIG. 11 illustrates that the fourth display element DE4, the fifth display element DE5, and the sixth display element DE6 are arranged in a pentile matrix structure, the present disclosure is not limited thereto. In another embodiment, the fourth display element DE4, the fifth display element DE5, and the sixth display element DE6 may be arranged in various shapes such as a stripe structure, a mosaic arrangement structure, and a delta arrangement structure in a plan view.

The fourth display element DE4 may include a fourth pixel electrode 210d. A fourth emission area EA4 of the fourth display element DE4 may be defined by a fourth opening OP4 exposing the fourth pixel electrode 210d. The fourth emission area EA4 of the fourth display element DE4 may correspond to the fourth opening OP4 exposing the fourth pixel electrode 210d. The fourth opening OP4 may be defined in the pixel defining layer 125 (see FIG. 12).

The fifth display element DE5 may include a fifth pixel electrode 210e. A fifth emission area EA5 of the fifth display element DE5 may be defined by a fifth opening OP5 exposing the fifth pixel electrode 210e. The fifth emission area EA5 of the fifth display element DE5 may correspond to the fifth opening OP5 exposing the fifth pixel electrode 210e. The fifth opening OP5 may be defined in the pixel defining layer 125. The fifth opening OP5 may be smaller than the fourth opening OP4. In other words, the fifth emission area EA5 may be smaller than the fourth emission area EA4.

The sixth display element DE6 may include a sixth pixel electrode 210f. A sixth emission area EA6 of the sixth display element DE6 may be defined by a sixth opening OP6 exposing the sixth pixel electrode 210f. The sixth emission area EA6 of the sixth display element DE6 may correspond to the sixth opening OP6 exposing the sixth pixel electrode 210f. The sixth opening OP6 may be defined in the pixel defining layer 125. The sixth opening OP6 may be smaller than the fifth opening OP5. In other words, the sixth emission area EA6 may be smaller than the fifth emission area EA5.

Referring to FIGS. 9 and 11, the number of first display elements DE1 per unit area may be the same as the number of fourth display elements DE4 per unit area. In other words, the number of first pixel electrodes 210a per unit area may be the same as the number of fourth pixel electrodes 210d per unit area. In other words, the number of first openings OP1 per unit area may be the same as the number of fourth openings OP4 per unit area. The number of second display elements DE2 per unit area may be the same as the number of fifth display elements DE5 per unit area. In other words, the number of second pixel electrodes 210b per unit area may be the same as the number of fifth pixel electrodes 210e per unit area. In other words, the number of second openings OP2 per unit area may be the same as the number of fifth openings OP5 per unit area. The number of third display elements DE3 per unit area may be the same as the number of sixth display elements DE6 per unit area. In other words, the number of third pixel electrodes 210c per unit area may be the same as the number of sixth pixel electrodes 210f per unit area. In other words, the number of third openings OP3 per unit area may be the same as the number of sixth openings OP6 per unit area.

In an embodiment, a distance between the first display element DE1 and the second display element DE2 adjacent to each other may be substantially the same as a distance between the fourth display element DE4 and the fifth display element DE5 adjacent to each other. In other words, a third distance d3 between the first opening OP1 and the second opening OP2 adjacent to each other may be substantially the same as a fourth distance d4 between the fourth opening OP4 and the fifth opening OP5 adjacent to each other. In other words, a fifth distance d5 between the first pixel electrode 210a and the second pixel electrode 210b adjacent to each other may be substantially the same as a sixth distance d6 between the fourth pixel electrode 210d and the fifth pixel electrode 210e adjacent to each other.

In an embodiment, a size of the first opening OP1 may be substantially the same as a size of the fourth opening OP4. A size of the second opening OP2 may be substantially the same as a size of the fifth opening OP5. A size of the third opening OP3 may be substantially the same as a size of the sixth opening OP6.

Unlike in the second area AR2, a seventh opening OP7 may be arranged between the first opening OP1 and the second opening OP2 in the first area AR1. In addition, unlike in the second area AR2, an eighth opening OP8 may be arranged between the second opening OP2 and the first opening OP1 in the first area AR1. That is, the seventh opening OP7 and the eighth opening OP8 may not be arranged in the second area AR2. The first area AR1 may transmit light and/or sound through the separate seventh and eighth openings OP7 and OP8, and thus may have greater light transmittance than the second area AR2. The light transmittance of the first area AR1 may be greater than the light transmittance of the second area AR2.

Figure 12:
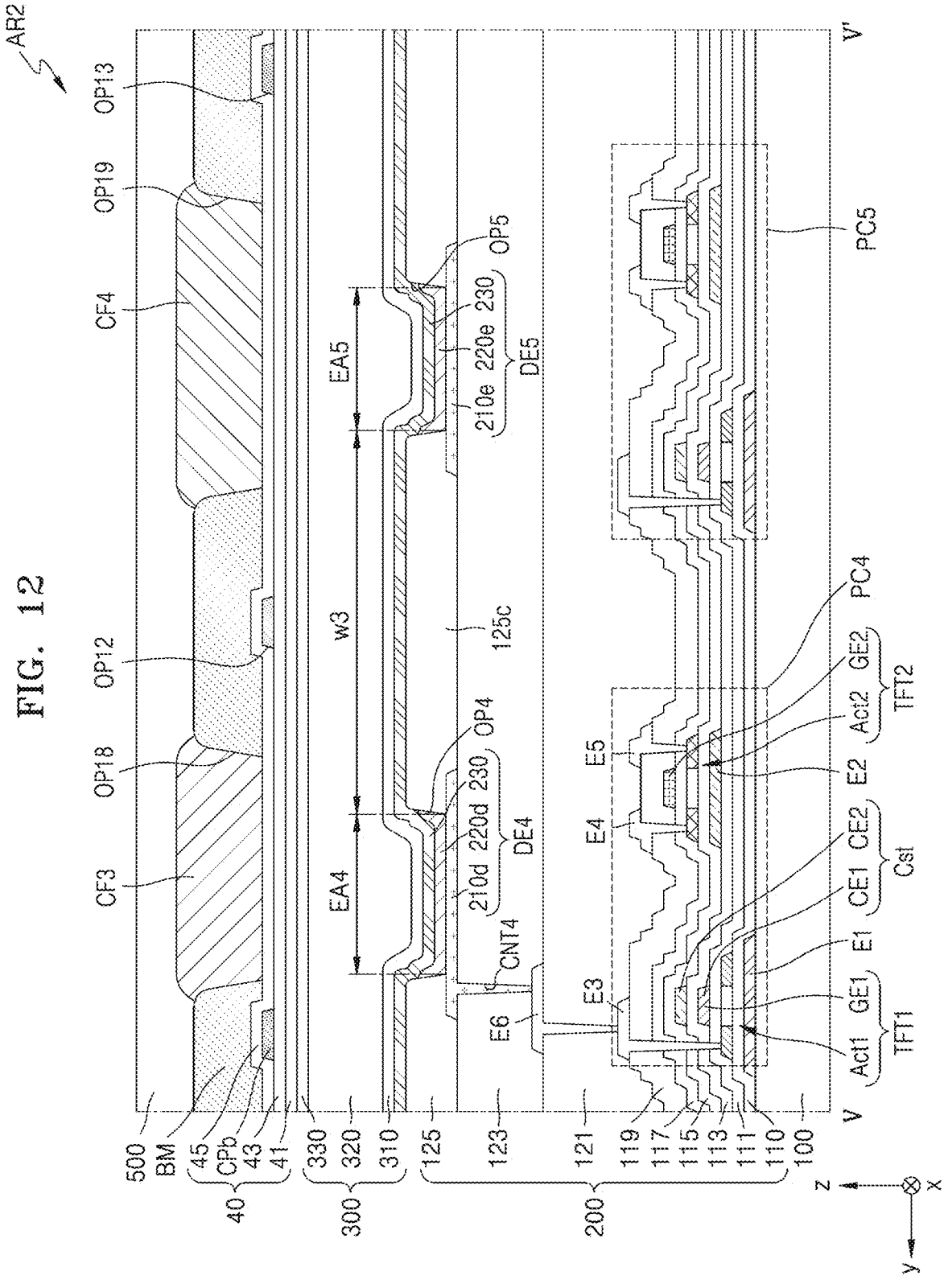
FIG. 12 is an example cross-sectional view of a region of FIG. 11, taken along line V-V'.

Referring back to FIG. 11, a second conductive pattern CPb may be arranged in the second area AR2 of the display apparatus 1. The second conductive pattern CPb may be included in (or correspond to) one of the first sensing electrodes 410, the first connection electrodes 411, the second sensing electrodes 420, and the second connection electrodes 421 illustrated in FIG. 5. The second conductive pattern CPb may define a twelfth opening OP12 overlapping the fourth opening OP4, a thirteenth opening OP13 overlapping the fifth opening OP5, and a fourteenth opening OP14 overlapping the sixth opening OP6 in a plan view. The twelfth opening OP12, the thirteenth opening OP13, and the fourteenth opening OP14 may expose a portion of an insulating layer arranged under the second conductive pattern CPb, as illustrated in FIG. 12 to be described below. The second conductive pattern CPb corresponds to the second mesh pattern MP2 of FIG. 3, and the twelfth to fourteenth openings OP12, OP13, and OP14 correspond to the second hole H2, the fourth hole H4, and the sixth hole H6 of FIG. 3, respectively.

In a plan view, the twelfth opening OP12 may have a closed loop shape surrounding the fourth opening OP4, the thirteenth opening OP13 may have a closed loop shape surrounding the fifth opening OP5, and the fourteenth opening OP14 may have a closed loop shape surrounding the sixth opening OP6 in a plan view.

The twelfth opening OP12, the thirteenth opening OP13, and the fourteenth opening OP14 may be provided in plurality. The plurality of twelfth openings OP12 and the plurality of thirteenth openings OP13 may be alternately arranged in the first direction (e.g., ±y direction) and the second direction (e.g., ±x direction). The plurality of fourteenth openings OP14 may be arranged in the first direction (e.g., ±y direction) and the second direction (e.g., ±x direction). The plurality of twelfth openings OP12 and the plurality of fourteenth openings OP14 may be alternately arranged in the third direction (e.g., the diagonal direction). The plurality of thirteenth openings OP13 and the plurality of fourteenth openings OP14 may be alternately arranged in the fourth direction (e.g., the diagonal direction) crossing the third direction.

Referring to FIGS. 9 and 11, a planar shape of the ninth opening OP9 of the first conductive pattern CPa may be different from a planar shape of the twelfth opening OP12 of the second conductive pattern CPb. A planar shape of the tenth opening OP10 of the first conductive pattern CPa may be different from a planar shape of the thirteenth opening OP13 of the second conductive pattern CPb. A planar shape of the eleventh opening OP11 of the first conductive pattern CPa may be different from a planar shape of the 14th opening OP14 of the second conductive pattern CPb in a plan view.

In an embodiment, the ninth opening OP9, the tenth opening OP10, the eleventh opening OP11, the twelfth opening OP12, the thirteenth opening OP13, and the fourteenth opening OP14 may have a polygonal shape in a plan view. The number of sides of each of the ninth opening OP9, the tenth opening OP10, and the eleventh opening OP11 may be greater than the number of sides of each of the twelfth opening OP12, the thirteenth opening OP13, and the fourteenth opening OP14. The number of sides of each of the ninth opening OP9, the tenth opening OP10, and the eleventh opening OP11 may be five or more, and the number of sides of each of the twelfth opening OP12, the thirteenth opening OP13, and the fourteenth opening OP14 may be four. For example, as illustrated in FIG. 9, the number of first sides ed1 of the ninth opening OP9 may be ten, the number of second sides ed2 of the tenth opening OP10 may be ten, and the number of third sides ed3 of the eleventh opening OP11 may be six. As illustrated in FIG. 11, the number of fourth sides ed4 of the twelfth opening OP12 may be four, the number of fifth sides ed5 of the thirteenth opening OP13 may be four, and the number of sixth sides ed6 of the fourteenth opening OP14 may be four.

In an embodiment, a size of the ninth opening OP9 of the first conductive pattern CPa may be different from a size of the twelfth opening OP12 of the second conductive pattern CPb. A size of the tenth opening OP10 of the first conductive pattern CPa may be different from a size of the thirteenth opening OP13 of the second conductive pattern CPb. A size of the eleventh opening OP11 of the first conductive pattern CPa may be different from a size of the 14th opening OP14 of the second conductive pattern CPb. For example, the ninth opening OP9 of the first conductive pattern CPa may be larger than the twelfth opening OP12 of the second conductive pattern CPb. The tenth opening OP10 of the first conductive pattern CPa may be larger than the thirteenth opening OP13 of the second conductive pattern CPb. The eleventh opening OP11 of the first conductive pattern CPa may be smaller than the fourteenth opening OP14 of the second conductive pattern CPb.

Referring back to FIG. 11, the light blocking layer BM may be arranged in the second area AR2 of the display apparatus 1. The light blocking layer BM may define an eighteenth opening OP18 overlapping the fourth opening OP4, a nineteenth opening OP19 overlapping the fifth opening OP5, and a twentieth opening OP20 overlapping the sixth opening OP6 in a plan view. As illustrated in FIG. 12 to be described below, the light blocking layer BM may be arranged on the second conductive pattern CPb, and the eighteenth opening OP18, the nineteenth opening OP19, and the twentieth opening OP20 may expose a portion of an insulating layer arranged between the second conductive pattern CPb and the light blocking layer BM.

In a plan view, the eighteenth opening OP18 may have a closed loop shape surrounding the fourth opening OP4, the nineteenth opening OP19 may have a closed loop shape surrounding the fifth opening OP5, and the twentieth opening OP20 may have a closed loop shape surrounding the sixth opening OP6 in a plan view. The eighteenth opening OP18 may be surrounded by the twelfth opening OP12, the nineteenth opening OP19 may be surrounded by the thirteenth opening OP13, and the twentieth opening OP20 may be surrounded by the fourteenth opening OP14. In other words, the eighteenth opening OP18 may be smaller than the twelfth opening OP12, the nineteenth opening OP19 may be smaller than the thirteenth opening OP13, and the twentieth opening OP20 may be smaller than the fourteenth opening OP14.

The eighteenth opening OP18, the nineteenth opening OP19, and the twentieth opening OP20 may be provided in plurality. The plurality of eighteenth openings OP18 and the plurality of nineteenth openings OP19 may be alternately arranged in the first direction (e.g., ±y direction) and the second direction (e.g., ±x direction). The plurality of twentieth openings OP20 may be arranged in the first direction (e.g., ±y direction) and the second direction (e.g., ±x direction). The plurality of eighteenth openings OP18 and the plurality of twentieth openings OP20 may be alternately arranged in the third direction (e.g., the diagonal direction). The plurality of nineteenth openings OP19 and the plurality of twentieth openings OP20 may be alternately arranged in the fourth direction (e.g., the diagonal direction) crossing the third direction.

Referring to FIGS. 9 and 11, a planar shape of the fifteenth opening OP15 of the light blocking layer BM arranged in the first area AR1 may be different from a planar shape of the eighteenth opening OP18 of the light blocking layer BM arranged in the second area AR2. A planar shape of the sixteenth opening OP16 of the light blocking layer BM arranged in the first area AR1 may be different from a planar shape of the nineteenth opening OP19 of the light blocking layer BM arranged in the second area AR2. A planar shape of the seventeenth opening OP17 of the light blocking layer BM arranged in the first area AR1 may be substantially the same as a planar shape of the twentieth opening OP20 of the light blocking layer BM arranged in the second area AR2.

For example, the planar shape of the eighteenth opening OP18 of the light blocking layer BM arranged in the second area AR2 may be circular, but the planar shape of the fifteenth opening OP15 of the light blocking layer BM arranged in the first area AR1 may not be circular. The planar shape of the nineteenth opening OP19 of the light blocking layer BM arranged in the second area AR2 may be circular, but the planar shape of the sixteenth opening OP16 of the light blocking layer BM arranged in the first area AR1 may not be circular. The planar shape of the seventeenth opening OP17 of the light blocking layer BM arranged in the first area AR1 and the planar shape of the twentieth opening OP20 of the light blocking layer BM arranged in the second area AR2 may each be circular.

In an embodiment, a size of the fifteenth opening OP15 may be different from a size of the eighteenth opening OP18. A size of the sixteenth opening OP16 may be different from a size of the nineteenth opening OP19. A size of the seventeenth opening OP17 may be substantially the same as a size of the twentieth opening OP20. For example, the fifteenth opening OP15 may be larger than the eighteenth opening OP18. The sixteenth opening OP16 may be larger than the nineteenth opening OP19.

FIG. 12 is an example cross-sectional view of a region of FIG. 11, taken along line V-V'. The same reference numerals in FIGS. 12 and 10 denote the same elements, and thus, redundant descriptions thereof are omitted.

Referring to FIG. 12, the fourth display element DE4 and the fifth display element DE5 may be arranged on the seventh insulating layer 123. The fourth display element DE4 may include the fourth pixel electrode 210*d*, a fourth interlayer 220*d*, and the opposite electrode 230, and the fifth display element DE5 may include the fifth pixel electrode 210*e*, a fifth interlayer 220*e*, and the opposite electrode 230.

The fourth pixel electrode 210*d* may be electrically connected to the fourth pixel circuit PC4 through the fourth contact hole CNT4. The fourth pixel circuit PC4 may include at least one transistor and at least one capacitor. For example, the fourth pixel circuit PC4 may include the first transistor TFT1, the second transistor TFT2, and the storage capacitor Cst. Although not illustrated in FIG. 12, as described above with reference to FIG. 9, the fifth pixel electrode 210*e* may be electrically connected to the fifth pixel circuit PC5 including at least one transistor and at least one capacitor through the fifth contact hole CNT5.

The pixel defining layer 125 may be arranged on the fourth pixel electrode 210*d* and the fifth pixel electrode 210*e* arranged apart from each other. The pixel defining layer 125 may define the fourth opening OP4 exposing the fourth pixel electrode 210*d* and the fifth opening OP5 exposing the fifth pixel electrode 210*e*.

Referring to FIGS. 10 and 12, the sum of the first width w1 of the first portion 125*a* of the pixel defining layer 125 and the second width w2 of the second portion 125*b* of the pixel defining layer 125 may be less than a third width w3 of a third portion 125*c* of the pixel defining layer 125. The first portion 125*a* of the pixel defining layer 125 may be located between the first opening OP1 and the seventh opening OP7, and the second portion 125*b* of the pixel defining layer 125 may be located between the second opening OP2 and the seventh opening OP7. The third portion 125*c* of the pixel defining layer 125 may be located between the fourth opening OP4 and the fifth opening OP5.

Referring back to FIG. 12, the touch sensing layer 40 may be arranged on the fourth display element DE4 and the fifth display element DE5. The touch sensing layer 40 may include the first sensing insulating layer 41, the second sensing insulating layer 43 on the first sensing insulating layer 41, the second conductive pattern CPb on the second sensing insulating layer 43, and the third sensing insulating layer 45 on the second conductive pattern CPb.

FIG. 12 illustrates that the second conductive pattern CPb is arranged between the second sensing insulating layer 43 and the third sensing insulating layer 45. However, in another embodiment, the second conductive pattern CPb may be arranged between the first sensing insulating layer 41 and the second sensing insulating layer 43.

The second conductive pattern CPb may define the twelfth opening OP12 overlapping the fourth opening OP4 and the thirteenth opening OP13 overlapping the fifth opening OP5 in a plan view. The twelfth opening OP12 and the thirteenth opening OP13 may expose a portion of the second sensing insulating layer 43 arranged under the second conductive pattern CPb.

The light blocking layer BM may be arranged on the touch sensing layer 40. The light blocking layer BM may define the eighteenth opening OP18 overlapping the fourth opening OP4 and the nineteenth opening OP19 overlapping the fifth opening OP5 in a plan view. The eighteenth opening OP18 and the nineteenth opening OP19 may expose a portion of the third sensing insulating layer 45 arranged between the second conductive pattern CPb and the light blocking layer BM.

At least a portion of a third color filter layer CF3 may be arranged in the eighteenth opening OP18 of the light blocking layer BM, and at least a portion of a fourth color filter layer CF4 may be arranged in the nineteenth opening OP19 of the light blocking layer BM. The third color filter layer CF3 and the fourth color filter layer CF4 may transmit light of different wavelength bands. For example, the third color filter layer CF3 may transmit only light of a wavelength ranging from about 450 nm to about 495 nm, and the fourth color filter layer CF4 may transmit only light of a wavelength ranging from about 630 nm to about 780 nm.

In an embodiment, the third color filter layer CF3 may contact a portion of the third sensing insulating layer 45 exposed by the eighteenth opening OP18 of the light blocking layer BM. The fourth color filter layer CF4 may contact a portion of the third sensing insulating layer 45 exposed by the nineteenth opening OP19 of the light blocking layer BM.

Although not illustrated in FIG. 12, as described above with reference to FIG. 11, the light blocking layer BM may define the twentieth opening OP20 overlapping the sixth opening OP6 defining the sixth emission area EA6 of the sixth display element DE6 in a plan view. The twentieth opening OP20 may expose a portion of the third sensing insulating layer 45 arranged between the second conductive pattern CPb and the light blocking layer BM. At least a portion of a color filter layer may be arranged in the twentieth opening OP20 of the light blocking layer BM. In this case, the color filter layer of which at least a portion is arranged in the twentieth opening OP20 may transmit only light of a wavelength ranging from about 495 nm to about 570 nm. The color filter layer of which at least a portion is arranged in the twentieth opening OP20 may contact a portion of the third sensing insulating layer 45 exposed by the twentieth opening OP20.

Figure 13:
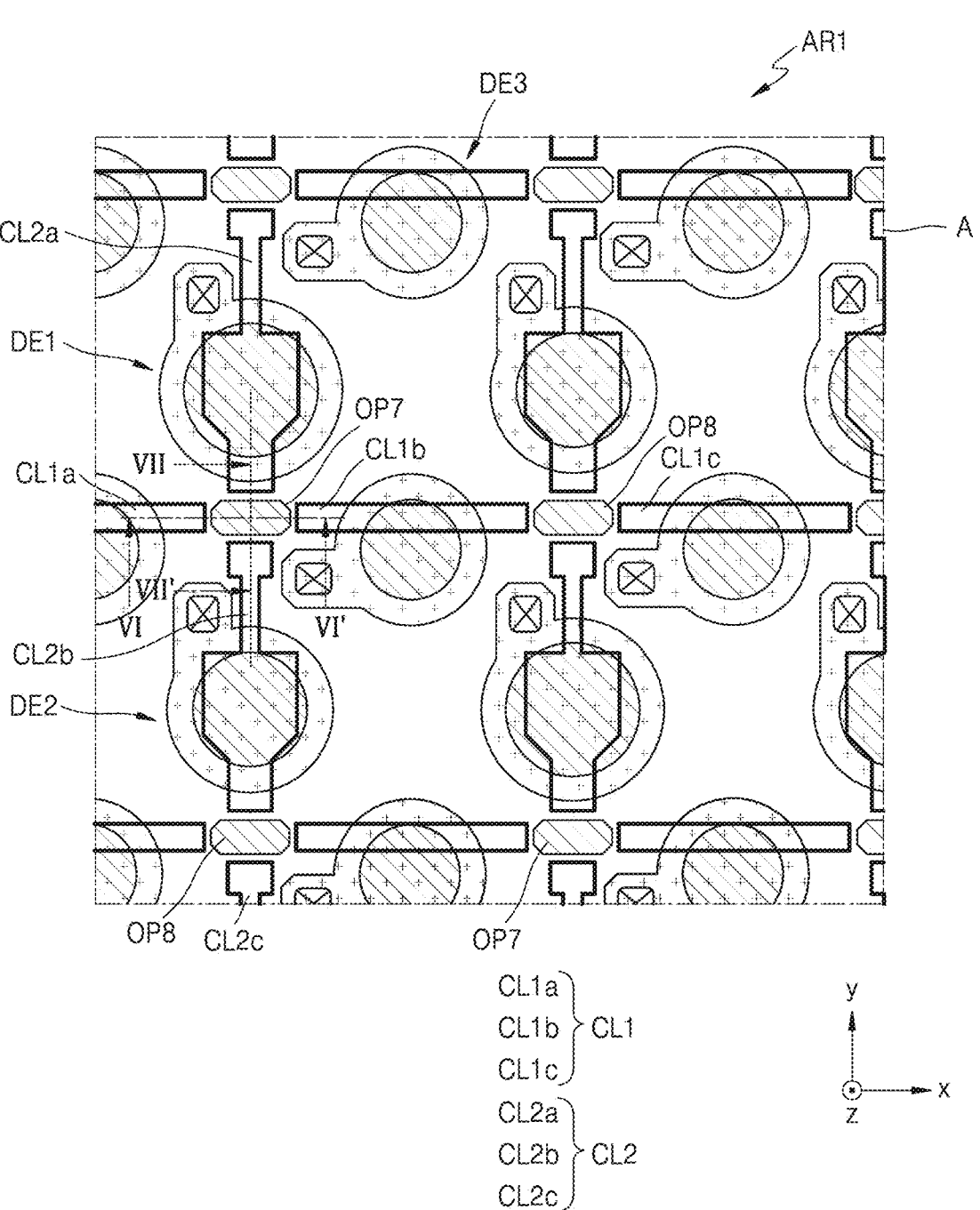
FIG. 13 is a schematic enlarged plan view of a portion of a first area of a display apparatus according to an embodiment.
Figure 14:
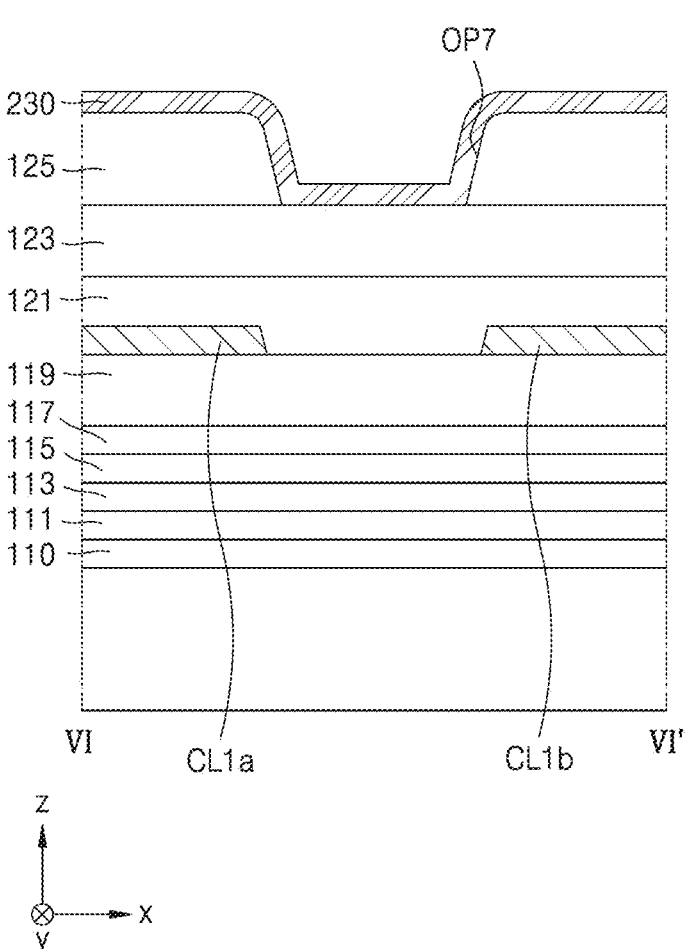
FIG. 14 is an example cross-sectional view of a region of FIG. 13, taken along line VI-VI'.
Figure 15:
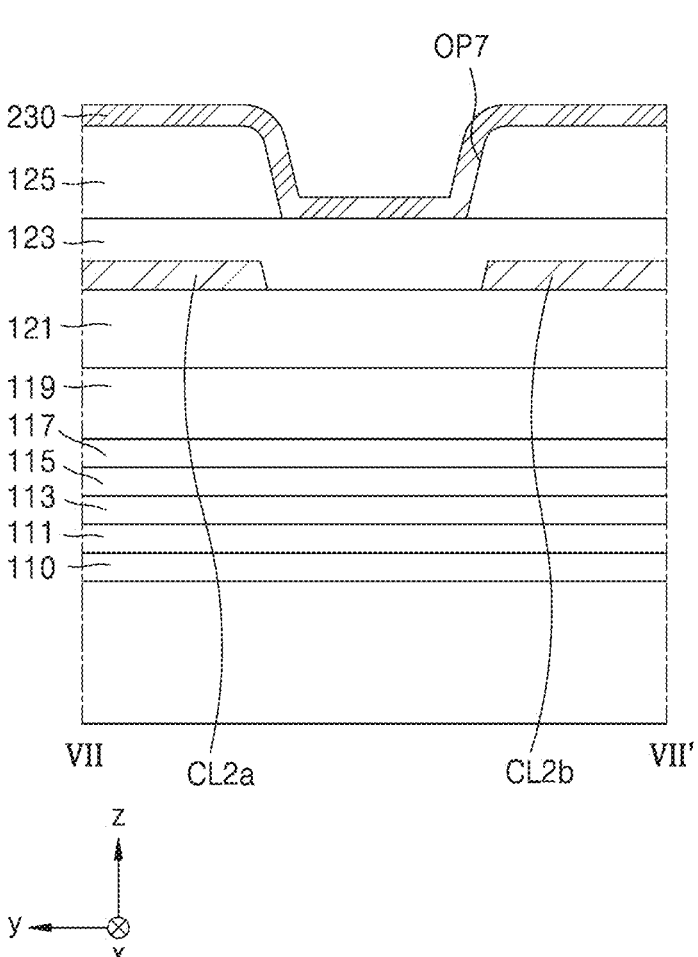
FIG. 15 is an example cross-sectional view of a region of FIG. 13, taken along line VII-VII'.

FIG. 13 is a schematic enlarged plan view of a portion of a first area of a display apparatus according to an embodiment. FIG. 14 is an example cross-sectional view of a region of FIG. 13, taken along line VI-VI', and FIG. 15 is an example cross-sectional view of a region of FIG. 13, taken along line VII-VII'. The same reference numerals in FIGS. 14 and 15 denote the same elements, and thus, redundant descriptions thereof are omitted.

Referring to FIG. 13, a first conductive line CL1 extending in the second direction (e.g., ±x direction) may be arranged in the first area AR1 of the display apparatus 1. The first conductive line CL1 may include a first portion CL1a, a second portion CL1b, and a third portion CL1c that are apart from each other. The first portion CL1a and the second portion CL1b may be apart from each other with the seventh opening OP7 therebetween. The second portion CL1b and the third portion CL1c may be apart from each other with the eighth opening OP8 therebetween. In other words, the seventh opening OP7 may be arranged between the first portion CL1a and the second portion CL1b. The eighth opening OP8 may be arranged between the second portion CL1b and the third portion CL1c.

In an embodiment, the first conductive line CL1 may be arranged under the seventh opening OP7. For example, as illustrated in FIG. 14, the first conductive line CL1 may be arranged between the fifth insulating layer 119 and the sixth insulating layer 121. FIG. 14 illustrates that the first conductive line CL1 is arranged between the fifth insulating layer 119 and the sixth insulating layer 121. However, the arrangement of the first conductive line CL1 may be variously modified, and in another embodiment, the first conductive line CL1 may be arranged between the sixth insulating layer 121 and the seventh insulating layer 123.

As such, the seventh opening OP7 and the eighth opening OP8 may not overlap the first conductive line CL1 arranged thereunder in a plan view. In this case, light transmittance through the seventh opening OP7 and the eighth opening OP8 may be secured.

Referring back to FIG. 13, a second conductive line CL2 extending in the first direction (e.g., ±y direction) may be arranged in the first area AR1 of the display apparatus 1. The second conductive line CL2 may include a first portion CL2a, a second portion CL2b, and a third portion CL2c that are apart from each other. The first portion CL2a and the second portion CL2b may be apart from each other with the seventh opening OP7 therebetween. The second portion CL2b and the third portion CL2c may be apart from each other with the eighth opening OP8 therebetween. In other words, the seventh opening OP7 may be arranged between the first portion CL2a and the second portion CL2b. The eighth opening OP8 may be arranged between the second portion CL2b and the third portion CL2c.

In an embodiment, the second conductive line CL2 may be arranged under the seventh opening OP7. For example, as illustrated in FIG. 15, the second conductive line CL2 may be arranged between the sixth insulating layer 121 and the seventh insulating layer 123. FIG. 15 illustrates that the second conductive line CL2 is arranged between the sixth insulating layer 121 and the seventh insulating layer 123. However, the arrangement of the second conductive line CL2 may be variously modified, and in another embodiment, the second conductive line CL2 may be arranged between the fifth insulating layer 119 and the sixth insulating layer 121.

As such, the seventh opening OP7 and the eighth opening OP8 may not overlap the second conductive line CL2 arranged thereunder in a plan view. In this case, light transmittance through the seventh opening OP7 and the eighth opening OP8 may be secured.

In an embodiment, the same voltage may be applied to the first conductive line CL1 and the second conductive line CL2. For example, a first driving voltage may be applied to the first conductive line CL1 and the second conductive line CL2. At least one of the first conductive line CL1 and the second conductive line CL2 may be electrically connected to at least one pixel circuit, and may transmit the first driving voltage to the at least one pixel circuit.

In another embodiment, different voltages may be applied to the first conductive line CL1 and the second conductive line CL2. For example, a second driving voltage that is applied to an opposite electrode may be applied to the first conductive line CL1, and the first driving voltage may be applied to the second conductive line CL2.

While a display apparatus has been mainly described above, the present disclosure is not limited thereto. For example, a method of manufacturing such a display apparatus also falls within the scope of the disclosure.

According to an embodiment as described above, a display apparatus where light transmittance of a portion of a display area is secured may be implemented. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus including an optical device, and including a first display area comprising a first area overlapping the optical device and a second display area comprising a second area surrounding at least a portion of the first area therein, the display apparatus comprising:

a first insulating layer arranged on a substrate;

at least one first pixel electrode and at least one second pixel electrode arranged apart from each other and disposed on the first insulating layer in the first area;

at least one third pixel electrode and at least onea fourth pixel electrode arranged apart from each other and disposed on the first insulating layer in the second area;

a second insulating layer arranged on the first insulating layer and defining first to fourth openings exposing the first to fourth pixel electrodes, respectively, wherein the second insulating layer further defines an auxiliary opening exposing a portion of the first insulating layer in the first area, and the auxiliary opening is located between the first opening and the second opening, wherein the at least one first pixel electrode comprises a plurality of first pixel electrodes and the at least one third pixel electrode comprises a plurality of third pixel electrodes, and a number of first pixel electrodes per first unit area of the first area (AR1) including the auxiliary opening is the same as a number of third pixel electrodes per second unit area of the second area (AR2), an area of the second unit area is the same as an area of the first unit area.

2. The display apparatus of claim 1, further comprising an opposite electrode arranged on the second insulating layer, wherein a portion of the opposite electrode is in contact with the exposed portion of the first insulating layer in the auxiliary opening.

3. The display apparatus of claim 1, further comprising first to fourth emission layers arranged in the first to fourth openings, respectively, wherein the first and third emission layers emit light of a first color, and the second and fourth emission layers emit light of a second color.

4. The display apparatus of claim 1, wherein a first distance between the first pixel electrode and the second pixel electrode is the same as a second distance between the third pixel electrode and the fourth pixel electrode in a first direction.

5. The display apparatus of claim 1, wherein a sum of a first width of a first portion of the second insulating layer and a second width of a second portion of the second insulating layer is less than a third width of a third portion of the second insulating layer in a first direction, the first portion is located between the first opening and the auxiliary opening, the second portion is located between the second opening and the auxiliary opening, and the third portion is located between the third opening and the fourth opening.

6. The display apparatus of claim 1, wherein light transmittance of the first area is greater than light transmittance of the second area.

7. The display apparatus of claim 1, further comprising:

a third insulating layer arranged on the second insulating layer; and a conductive pattern arranged on the third insulating layer and defining a fifth opening exposing a portion of the third insulating layer, wherein the fifth opening overlaps the first opening and the auxiliary opening in a plan view.

8. The display apparatus of claim 7, further comprising a light blocking layer arranged on the conductive pattern and defining a sixth opening overlapping the first opening and the auxiliary opening in the plan view.

9. The display apparatus of claim 8, wherein the fifth opening has a closed loop shape surrounding the sixth opening in the plan view, and the sixth opening has a closed loop shape surrounding the first opening and the auxiliary opening in the plan view.

10. The display apparatus of claim 8, further comprising a color filter layer arranged in the sixth opening of the light blocking layer and overlapping the first opening of the second insulating layer in the plan view.

11. The display apparatus of claim 10, wherein the color filter layer does not overlap the auxiliary opening of the second insulating layer in the plan view.

12. The display apparatus of claim 1, further comprising a conductive line arranged between the substrate and the first insulating layer and having a first portion and a second portion that are apart from each other with the auxiliary opening therebetween in a plan view.

13. The display apparatus of claim 12, wherein the first pixel electrode and the second pixel electrode are apart from each other in a first direction, and the conductive line extends in the first direction.

14. The display apparatus of claim 12, wherein the first pixel electrode and the second pixel electrode are apart from each other in a first direction, and the conductive line extends in a second direction crossing the first direction.

15. The display apparatus of claim 1, wherein a first distance between the first opening and the auxiliary opening is less than a second distance between the second opening and the auxiliary opening in a first direction.

16. The display apparatus of claim 1, wherein a size of the first opening is different from a size of the second opening in a plan view.

* * * * *